(12) United States Patent
Ooishi

(10) Patent No.: US 6,857,093 B2
(45) Date of Patent: Feb. 15, 2005

(54) SEMICONDUCTOR INTEGRATED CIRCUIT DEVICE CAPABLE OF SELF-TESTING INTERNAL POWER SUPPLY CURRENTS PROVIDED TO INTERNAL CIRCUITS INTEGRATED ON CHIP

(75) Inventor: Tsukasa Ooishi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 645 days.

(21) Appl. No.: 09/986,583

(22) Filed: Nov. 9, 2001

(65) Prior Publication Data
US 2002/0190742 A1 Dec. 19, 2002

(30) Foreign Application Priority Data
Jun. 7, 2001 (JP) ........................................ 2001-172187

(51) Int. Cl.$^7$ ............................................. G01R 31/28
(52) U.S. Cl. ..................... 714/733; 327/143; 324/76.11
(58) Field of Search ................. 324/424, 765, 324/76.11; 327/143; 340/664; 714/733, 745

(56) References Cited

U.S. PATENT DOCUMENTS

| | | | |
|---|---|---|---|
| 4,814,712 A | * | 3/1989 | Burton et al. ............... 324/424 |
| 5,030,845 A | * | 7/1991 | Love et al. .................. 327/143 |
| 5,203,867 A | * | 4/1993 | Love et al. .................. 327/143 |
| 5,764,655 A | | 6/1998 | Kirihata et al. |
| 6,104,304 A | * | 8/2000 | Clark et al. ................. 340/664 |

FOREIGN PATENT DOCUMENTS

| | | | | |
|---|---|---|---|---|
| JP | 02-157677 | * | 6/1990 | ................. 324/765 |
| JP | 7-151817 | | 6/1995 | |
| JP | 11-31399 | | 2/1999 | |

* cited by examiner

Primary Examiner—David Ton
(74) Attorney, Agent, or Firm—McDermott Will & Emery LLP

(57) ABSTRACT

The semiconductor integrated circuit device includes an internal power supply circuit placed between a prescribed one of a plurality of internal circuits and a power supply interconnection for converting a level of an external power supply potential to supply an internal power supply potential to the prescribed internal circuit, and a control circuit for conducting a self-test of the semiconductor integrated circuit device. The control circuit detects a current amount being supplied from the internal power supply circuit to the prescribed internal circuit. The detected result is externally output via a data input/output unit.

28 Claims, 24 Drawing Sheets

SEMICONDUCTOR INTEGRATED CIRCUIT DEVICE CAPABLE OF SELF-TESTING INTERNAL POWER SUPPLY CURRENTS PROVIDED TO INTERNAL CIRCUITS INTEGRATED ON CHIP

BACKGROUND OF THE INVENTION

1. Field of the Invention

The present invention relates to configurations of semiconductor integrated circuit devices and testing devices for the semiconductor integrated circuit devices. More particularly, the present invention relates to a configuration for testing a current value being supplied to an internal circuit mounted to a semiconductor integrated circuit device.

2. Description of the Background Art

Conventionally, when a circuit having one function is mounted on a chip, an operating current or the like of the semiconductor integrated circuit device has been tested by monitoring with an external tester an operating voltage or a current being consumed in the semiconductor integrated circuit device.

For the purposes of speeding and improving the functionality of a system formed of a semiconductor integrated circuit device, a so-called system LSI (Large Scale Integrated circuit) has become widespread wherein a group of circuits having a plurality of functions are integrated on a chip.

Such a plurality of internal circuits having different functions mounted on a single chip, however, may have operating voltages different from each other.

Specifically, of the plurality of internal circuits, some circuits may operate with a voltage that is down-converted from an externally supplied power supply voltage by an internal power supply circuit, and other circuits may operate with an external power supply voltage without alteration. In such a case, simply monitoring the operating current or operating voltage from the outside of the semiconductor integrated circuit device would be insufficient to exactly determine whether each of the internal circuits having different functions is operating normally.

SUMMARY OF THE INVENTION

In view of the foregoing, an object of the present invention is to provide a semiconductor integrated circuit device having a testing function allowing accurate evaluation of an operation of each internal circuit, even if a plurality of internal circuits having different functions are mounted on a chip and they differ in operating voltages from each other.

Another object of the present invention is to provide a testing device having a testing function allowing accurate evaluation of the operation of each internal circuit, even when a plurality of semiconductor integrated circuit devices are tested in a batch.

In summary, according to an aspect of the present invention, the semiconductor integrated circuit device formed on a main surface of a semiconductor substrate includes a plurality of internal circuits, a first power supply interconnection, a second power supply interconnection, an internal power supply circuit, a testing circuit, and a data output circuit.

The plurality of internal circuits are formed on the main surface. The first power supply interconnection provides the plurality of internal circuits with a first external power supply potential that is externally supplied to the semiconductor integrated circuit device. The second power supply interconnection provides the plurality of internal circuits with a second external power supply potential that is externally supplied to the semiconductor integrated circuit device. The internal power supply circuit is provided between a prescribed one of the internal circuits and the second power supply interconnection, which converts a level of the second external power supply potential to provide an internal power supply potential to the prescribed internal circuit.

The testing circuit conducts a self-test of the semiconductor integrated circuit device. The testing circuit includes a measuring circuit detecting a current amount that the internal power supply circuit provides to the prescribed internal circuit. The data output circuit outputs the detected result to the outside of the semiconductor integrated circuit device.

According to another aspect of the present invention, the semiconductor integrated circuit device formed on a main surface of a semiconductor substrate includes a plurality of internal circuits, a first power supply interconnection, a second power supply interconnection, an internal power supply control circuit, a testing circuit, and a data output circuit.

The plurality of internal circuits are formed on the main surface. The first power supply interconnection provides the plurality of internal circuits with a first external power supply potential externally supplied to the semiconductor integrated circuit device. The second power supply interconnection provides the plurality of internal circuits with a second external power supply potential externally supplied to the semiconductor integrated circuit device. The internal power supply control circuit is provided between a prescribed one of the plurality of internal circuits and the second power supply interconnection to control the supply of an internal power supply potential to the prescribed internal circuit.

The testing circuit conducts a self-test of the semiconductor integrated circuit device. The testing circuit includes a measuring circuit detecting a current amount provided from the second power supply interconnection to the prescribed internal circuit. The data output circuit outputs the detected result to the outside of the semiconductor integrated circuit device.

According to a further aspect of the present invention, the semiconductor integrated circuit device formed on a main surface of a semiconductor substrate includes a plurality of internal circuits, a first power supply interconnection, a second power supply interconnection, an internal power supply control circuit, a testing circuit, and a shutdown circuit.

The plurality of internal circuits are formed on the main surface. The first power supply interconnection provides the plurality of internal circuits with a first external power supply potential externally supplied to the semiconductor integrated circuit device. The second power supply interconnection provides the plurality of internal circuits with a second external power supply potential externally supplied to the semiconductor integrated circuit device. The internal power supply control circuit is provided between a prescribed one of the plurality of internal circuits and the second power supply interconnection, and controls the supply of an internal power supply potential to the prescribed internal circuit.

The testing circuit conducts a self-test of the semiconductor integrated circuit device. The testing circuit includes a measuring circuit detecting a current amount being provided from the second power supply interconnection to the prescribed internal circuit. The shutdown circuit, in response to the detected result, suspends the potential supply from the internal power supply control circuit to a power supply node of the prescribed internal circuit.

According to yet another aspect of the present invention, the testing circuit for testing a plurality of semiconductor integrated circuit devices in a batch includes a signal interconnection, a first power supply interconnection, a second power supply interconnection, a power supply control circuit, a testing circuit, and a shutdown circuit.

The signal interconnection is commonly provided for the plurality of semiconductor integrated circuit devices to transmit a signal to and from the plurality of semiconductor integrated circuit devices. The first power supply interconnection is commonly provided for the plurality of semiconductor integrated circuit devices to supply a first external power supply potential thereto. The second power supply interconnection is commonly provided for the plurality of semiconductor integrated circuit devices to supply a second external power supply potential thereto. The power supply control circuit is provided between respective one of the plurality of semiconductor integrated circuit devices and the second power supply interconnection to control the supply of the second power supply potential to the relevant semiconductor integrated circuit device.

The testing circuit is provided for respective one of the semiconductor integrated circuit devices to detect a current amount supplied from the second power supply interconnection to the relevant semiconductor integrated circuit device. The shutdown circuit is provided for respective one of the semiconductor integrated circuit devices to suspend the potential supply from the power supply control circuit to the relevant semiconductor integrated circuit device according to the detected result of the testing circuit.

Accordingly, an advantage of the present invention is that, during the self-test, a tested result of the current value supplied by an internal power supply circuit provided corresponding to an internal circuit can be externally output. Thus, the present invention enables self-testing of the internal power supply current value being supplied to each internal circuit, even when a plurality of internal circuits having different functions are provided on a chip and an internal power supply circuit is provided corresponding to the internal circuit.

Another advantage of the present invention is that information about the current value being supplied to each internal circuit can be externally output.

A further advantage of the present invention is that it also enables self-testing of the current value being supplied to each internal circuit.

Yet another advantage of the present invention is that, even if a plurality of semiconductor integrated circuit devices are tested in a batch, a semiconductor integrated circuit device exhibiting an abnormal current consumption amount is prevented from affecting measurement of another semiconductor integrated circuit device.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 13 is a schematic block diagram selectively illustrating a configuration for testing a current amount supplied from the internal power supply circuit 230.1 or the like to the internal circuit 100.4 or the like.

DESCRIPTION OF THE PREFERRED EMBODIMENTS

Hereinafter, embodiments of the present invention will be described with reference to the drawings.

First Embodiment

Figure 1:
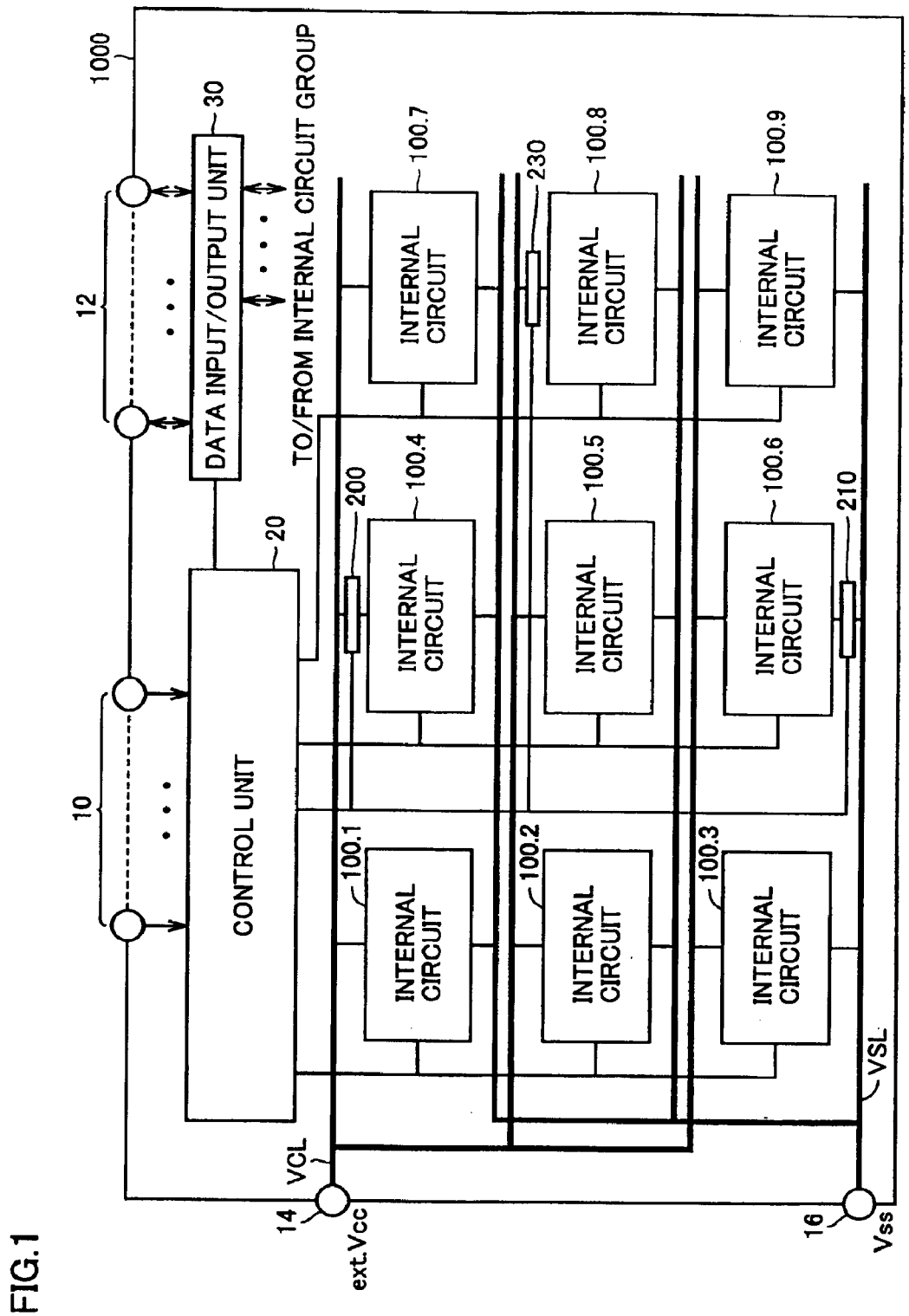
FIG. 1 is a schematic block diagram showing a circuit configuration of a semiconductor integrated circuit device 1000 of a first embodiment of the present invention.

Referring to FIG. 1, the semiconductor integrated circuit device 1000 according to the first embodiment includes: a control signal input terminal group 10 for receiving externally supplied control signals; a data input/output terminal group 12 for sending data to and receiving data from the outside; a power supply terminal 14 for receiving an external power supply potential ext.Vcc from the outside; a ground terminal 16 for receiving a ground potential Vss from the outside; a control unit 20 for controlling an operation of the semiconductor integrated circuit device based on the signals from external control signal input terminal group 10; a data input/output unit 30 for sending data to and receiving data from the outside via data input/output terminal group 12; internal circuits 100.1–100.9 controlled by control unit 20 for sending data to and receiving data from data input/output unit 30 as well as transmitting data with each other to respectively perform prescribed data processing; a power supply interconnection VCL for transmitting external power supply potential ext.Vcc from power supply terminal 14 to respective internal circuits 100.1–100.9; and a ground interconnection VSL for transmitting ground potential Vss from ground terminal 16 to respective internal circuits 100.1–100.9.

Semiconductor integrated circuit device 1000 further includes: an internal power supply circuit 200 provided between internal circuit 100.4 and power supply interconnection VCL for down-converting external power supply potential ext.Vcc to supply the reduced potential to internal circuit 100.4; an internal power supply circuit 210 provided between internal circuit 100.6 and ground interconnection VSL for boosting ground potential Vss by a prescribed potential level to supply the increased potential to internal circuit 100.6; and an internal power supply circuit 230 provided between internal circuit 100.8 and power supply interconnection VCL for converting external power supply potential ext.Vcc to a prescribed potential level for supply to internal circuit 100.8.

Although nine internal circuits 100.1–100.9 constitute a circuit group in FIG. 1, the present invention is not limited thereto, but applicable to the case where a larger or smaller number of internal circuits constitute the circuit group.

Further, although the internal power supply circuits have been provided only for internal circuits 100.4, 100.6 and 100.8 in FIG. 1, the present invention is not limited thereto. An internal power supply circuit having a configuration similar to any of the internal power supply circuits 200, 210 and 230 may be provided for each of the remaining internal circuits. More generally, two kinds of internal power supply circuits, one having a configuration similar to internal power supply circuit 200 or 230 and the other having a configuration similar to internal power supply circuit 210, both may be provided for one internal circuit.

Figure 2:
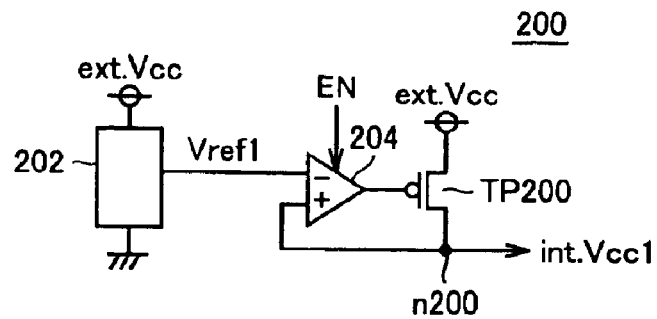
FIG. 2 is a circuit diagram illustrating a configuration of the internal power supply circuit 200 within the configuration shown in FIG. 1.

FIG. 2 shows a configuration of internal power supply circuit 200 illustrated in FIG. 1.

Internal power supply circuit 200 includes: a reference potential generating circuit 202 that operates by receiving external power supply potential ext.Vcc and ground potential Vss and generates a reference potential Vref1 having a prescribed potential level between external power supply potential ext.Vcc and ground potential Vss; a comparator 204 that is activated in response to an activating signal EN from control unit 20 and has its minus input node receiving reference potential Vref1; and a P channel MOS transistor TP200 that is provided between external power supply potential ext.Vcc and an internal node n200 and has its gate receiving an output of comparator 204.

Internal node n200 is coupled to a plus input node of comparator 204. The potential level of this internal node n200 is supplied to internal circuit 100.4 as an internal power supply potential int.Vcc1.

Figure 3:
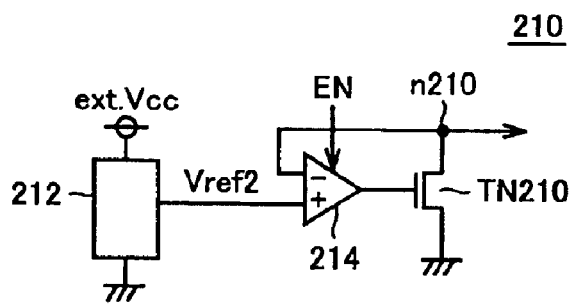
FIG. 3 is a circuit diagram illustrating a configuration of the internal power supply circuit 210 shown in FIG. 1.

FIG. 3 shows a configuration of internal power supply circuit 210 shown in FIG. 1.

Internal power supply circuit 210 includes: a reference potential generating circuit 212 that operates by receiving external power supply potential ext.Vcc and ground potential Vss and outputs a reference potential Vref2 of a prescribed potential level between external power supply potential ext.Vcc and ground potential Vss; a comparator 214 that is activated in response to control signal EN from control unit 20 and has its plus input node receiving reference potential Vref2; and an N channel MOS transistor TN210 that is provided between an internal node n210 and ground potential Vss.

The gate of transistor TN210 receives an output of comparator 214. Node n210 is coupled to the minus input node of comparator 214. The potential level of node n210 is supplied to internal circuit 100.6 as a level-converted ground potential.

Figure 4:
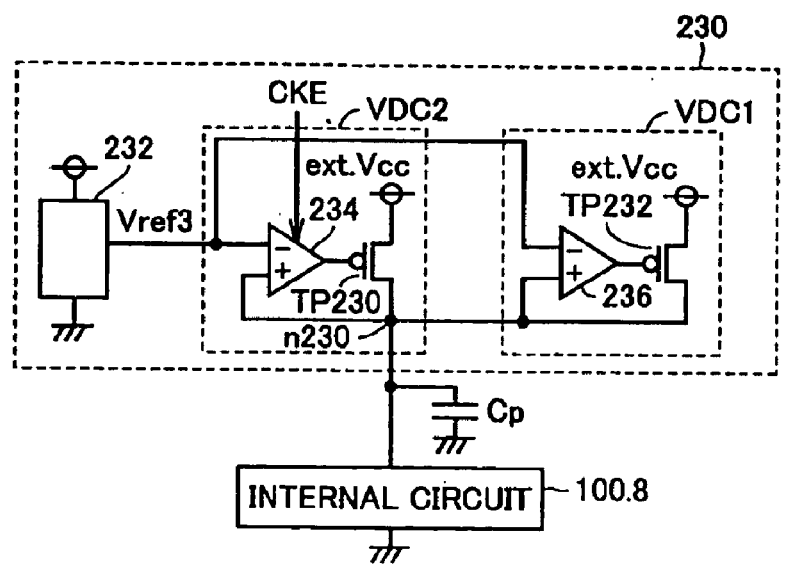
FIG. 4 is a circuit diagram illustrating a configuration of the internal power supply circuit 230 shown in FIG. 1.

FIG. 4 shows a configuration of internal power supply circuit 230 shown in FIG. 1.

Referring to FIG. 4, internal power supply circuit 230 includes: a reference potential generating circuit 232 that operates by receiving external power supply potential ext.Vcc and ground potential Vss and outputs a reference potential Vref3 of a prescribed potential level between external power supply potential ext.Vcc and ground potential Vss; a voltage converting circuit VDC1 that generates an internal power supply potential when internal circuit 100.8 is in operation or on standby; and a voltage converting circuit VDC2 that generates the internal power supply potential when internal circuit 100.8 is in operation.

Voltage converting circuit VDC2 includes: a comparator 234 that is activated in response to a control signal CKE from control unit 20 and has its minus input node receiving reference potential Vref3; and a P channel MOS transistor TP230 that is provided between external power supply potential ext.Vcc and an internal node n230 and has its gate receiving an output of comparator 234. Node n230 is coupled to the plus input node of comparator 234.

Voltage converting circuit VDC1 includes: a comparator 236 having its minus input node receiving reference potential Vref3; and a P channel MOS transistor TP232 that is provided between external power supply potential ext.Vcc and internal node n230 and has its gate receiving an output of comparator 236. Node n230 is also coupled to the plus input node of comparator 236. Transistor TP232 is made smaller in size (or gate width) than transistor TP230. In addition, the design parameters for comparator 236 are set such that it consumes a smaller current than comparator 234 with smaller driving capability.

The potentials supplied from transistors TP230 and TP232 to node n230 drive a parasitic resistance Cp and internal circuit 100.8.

Here, signal CKE is a signal that is inactivated when internal circuit 100.8 is not in operation. Thus, while comparator 236 and transistor TP232 constantly operate as long as power is being supplied, comparator 234 and transistor TP230 operate only when signal CKE is active.

Thus, during standby of internal circuit 100.8, only comparator 236 and transistor TP232 consuming smaller currents are made to operate to maintain the potential level of node n230. During operation of internal circuit 100.8, comparator 234 and transistor TP230 having larger current driving capabilities are additionally made to operate. This brings about an advantage that the current being consumed during standby of internal circuit 100.8 by the comparator circuit requiring an operating current even during standby can be reduced.

Figure 5:
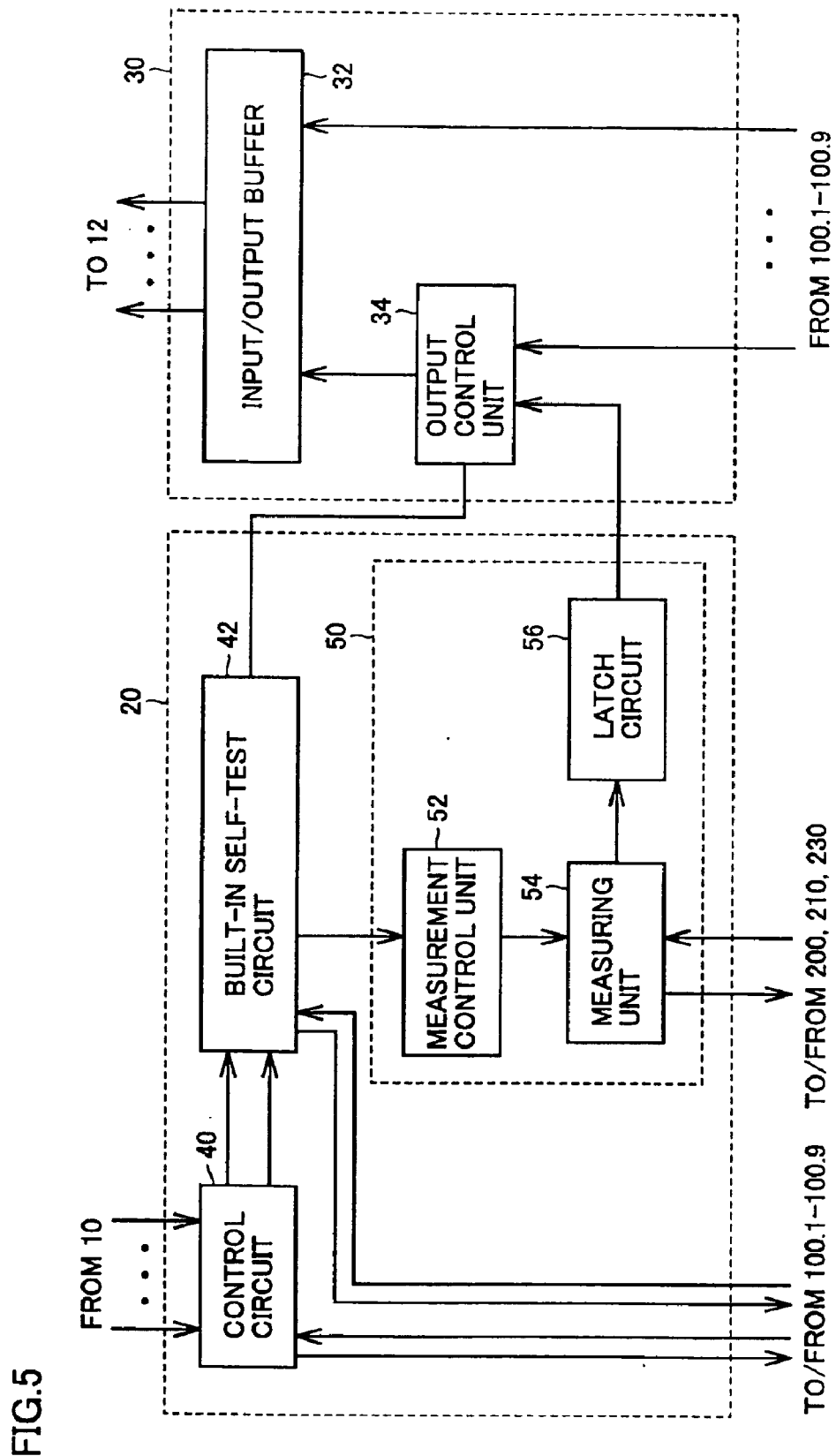
FIG. 5 is a schematic block diagram selectively illustrating configurations of the control unit 20 and data input/output unit 30 shown in FIG. 1.

FIG. 5 selectively shows configurations of control unit 20 and data input/output unit 30 shown in FIG. 1.

Control unit 20 includes: a control circuit 40 that outputs, in response to the signals supplied from control signal input terminal group 10, a signal for controlling start and end of a built-in self-test as well as signals for controlling the operations of internal circuits 100.1–100.9 in a normal operation; a built-in self-test circuit 42 that starts the built-in self-test in response to a signal from control circuit 40 and sends data to and receives data from internal circuits 100.1–100.9 to carry out the self-test; and an internal power supply test circuit 50 that is controlled by built-in self-test circuit 42 and tests the operating current values of internal power supply circuits 200, 210 and 230.

Internal power supply test circuit 50 includes: a measurement control unit 52 for controlling an operation for measurement of the internal power supply circuits according to the control of built-in self-test circuit 42; a measuring unit 54 controlled by measurement control unit 52 for measuring the power supply current values provided by respective internal power supply circuits 200, 210 and 230; and a latch circuit 56 that receives from measuring unit 54 and holds the results of measurement of the respective power supply circuits.

When the measurement of the operating currents of the internal power supply circuits is completed, according to a designation from built-in self-test circuit 42, an output control unit 34 within data input/output unit 30 receives the test results held in latch circuit 56, and externally outputs the test results via input/output buffer 32.

In a normal operation, output control unit 34 receives signals from internal circuits 100.1–100.9 and outputs them to input/output buffer 32, from which the output data of internal circuits 100.1–100.9 are externally output via prescribed terminals of data input/output terminal group 12.

With the configuration described above, during the built-in self-test after power on, the test results of the supply current values of the internal power supply circuits provided corresponding to the internal circuits can be externally output. Accordingly, even when a plurality of internal circuits having different functions are provided on a chip and internal power supply circuits are provided for the respective internal circuits, it is possible to perform a self-test of the internal power supply current value being supplied to each internal circuit.

Variation of First Embodiment

In the configuration of semiconductor integrated circuit device 1000 of the first embodiment shown in FIG. 1, internal power supply circuits 200, 210 and 230 have been provided for prescribed ones of the internal circuits. In addition, for the internal power supply circuit 230, two separate circuit systems have been prepared for generating the internal power supply potential to reduce the standby current.

To further reduce the standby current, a switch circuit may be provided between respective one of the internal circuits and power supply interconnection VCL or ground potential VSL.

Figure 6:
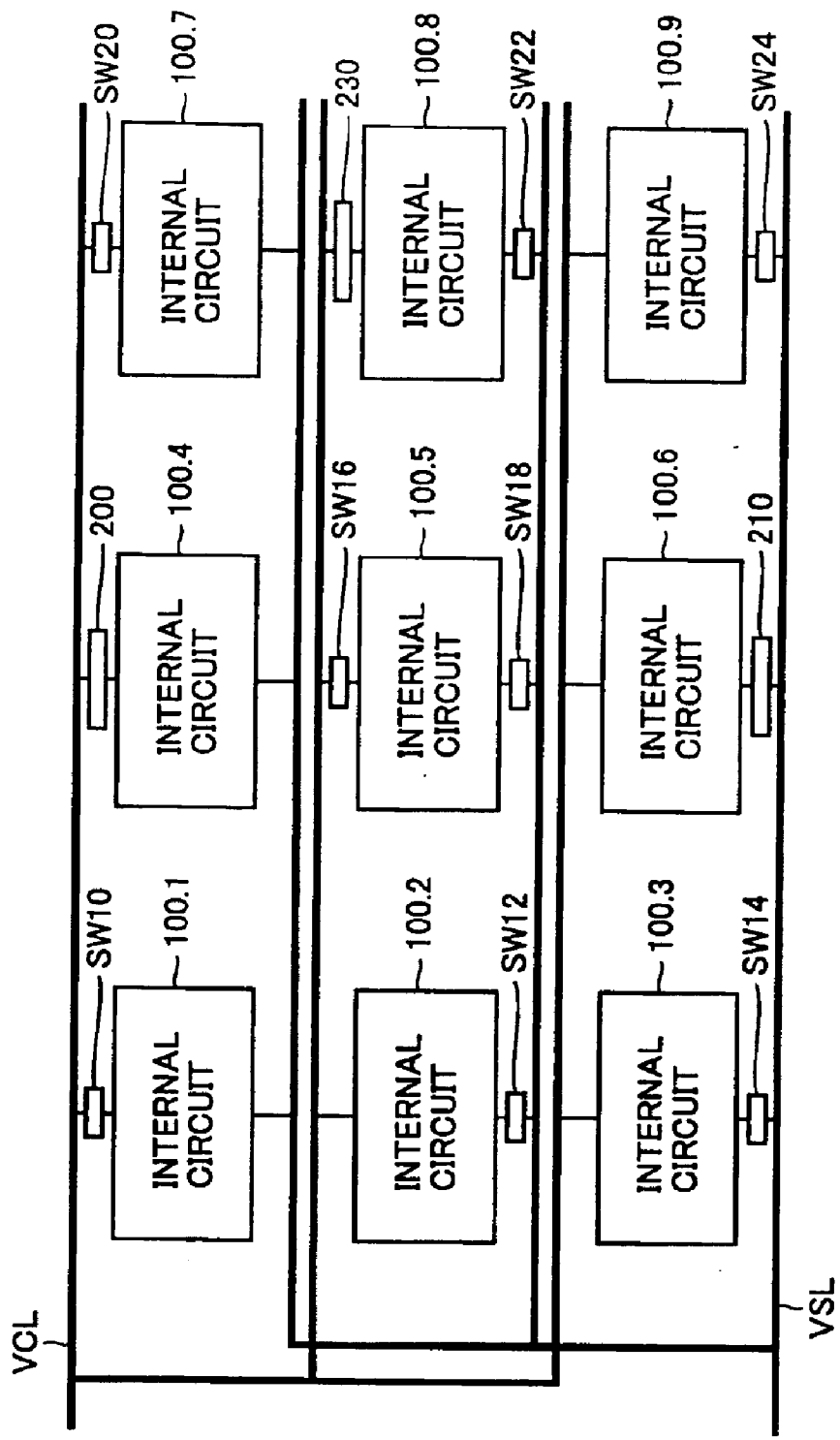
FIG. 6 is a schematic block diagram illustrating a configuration of the internal circuit group according to a variation of the first embodiment.

FIG. 6 shows a configuration of the internal circuit group according to the variation of the first embodiment, provided with such switches.

Referring to FIG. 6, a switch circuit SW10 is provided between internal circuit 100.1 and power supply interconnection VCL. A switch circuit SW12 is provided between internal circuit 100.2 and ground interconnection VSL.

For the remaining internal circuits, as shown in FIG. 6, switch circuits are provided between the respective internal circuits and power supply interconnection VCL or ground interconnection VSL where appropriate.

These switch circuits SW10–SW24 are shut down when the corresponding internal circuits are not in operation, under the control of control circuit 20.

This results in an advantage that the current being consumed during standby can further be reduced.

Figure 7:
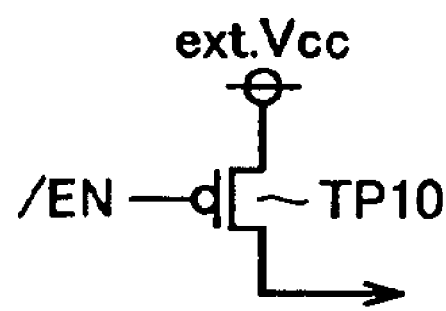
FIG. 7 is a circuit diagram illustrating a configuration of the switch circuit SW10 provided between the power supply interconnection VCL and the internal circuit, among the switch circuits shown in FIG. 6.

FIG. 7 shows a configuration of one of the switch circuits shown in FIG. 6 provided between power supply interconnection VCL and an internal circuit, e.g., switch circuit SW10.

Switch circuit SW10 includes a P channel MOS transistor TP10 provided between external power supply potential ext.Vcc and the corresponding internal circuit. Transistor TP10 has its gate receiving a signal/EN output from control circuit 20 that attains an L level when the corresponding internal circuit is active.

Figure 8:
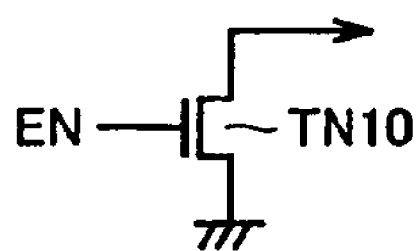
FIG. 8 is a circuit diagram illustrating a configuration of the switch circuit SW12 provided between the internal circuit and the ground interconnection VSL.

FIG. 8 shows a configuration of the switch circuit provided between an internal circuit and ground interconnection VSL, e.g., switch circuit SW12.

Switch circuit SW12 includes an N channel MOS transistor TN10 provided between ground interconnection VSL and the corresponding internal circuit.

Transistor TN10 has its gate receiving the control signal EN output from control circuit 20 that attains an H level when the corresponding internal circuit is active.

With such a configuration, the standby current is further reduced. In addition, during the built-in self-test, the internal power supply current value supplied from the internal power supply circuit can be tested. Accordingly, it is possible to reject a semiconductor integrated circuit device having an internal circuit receiving an extremely large power supply current value from an internal power supply circuit, as a defective product.

Second Embodiment

Figure 9:
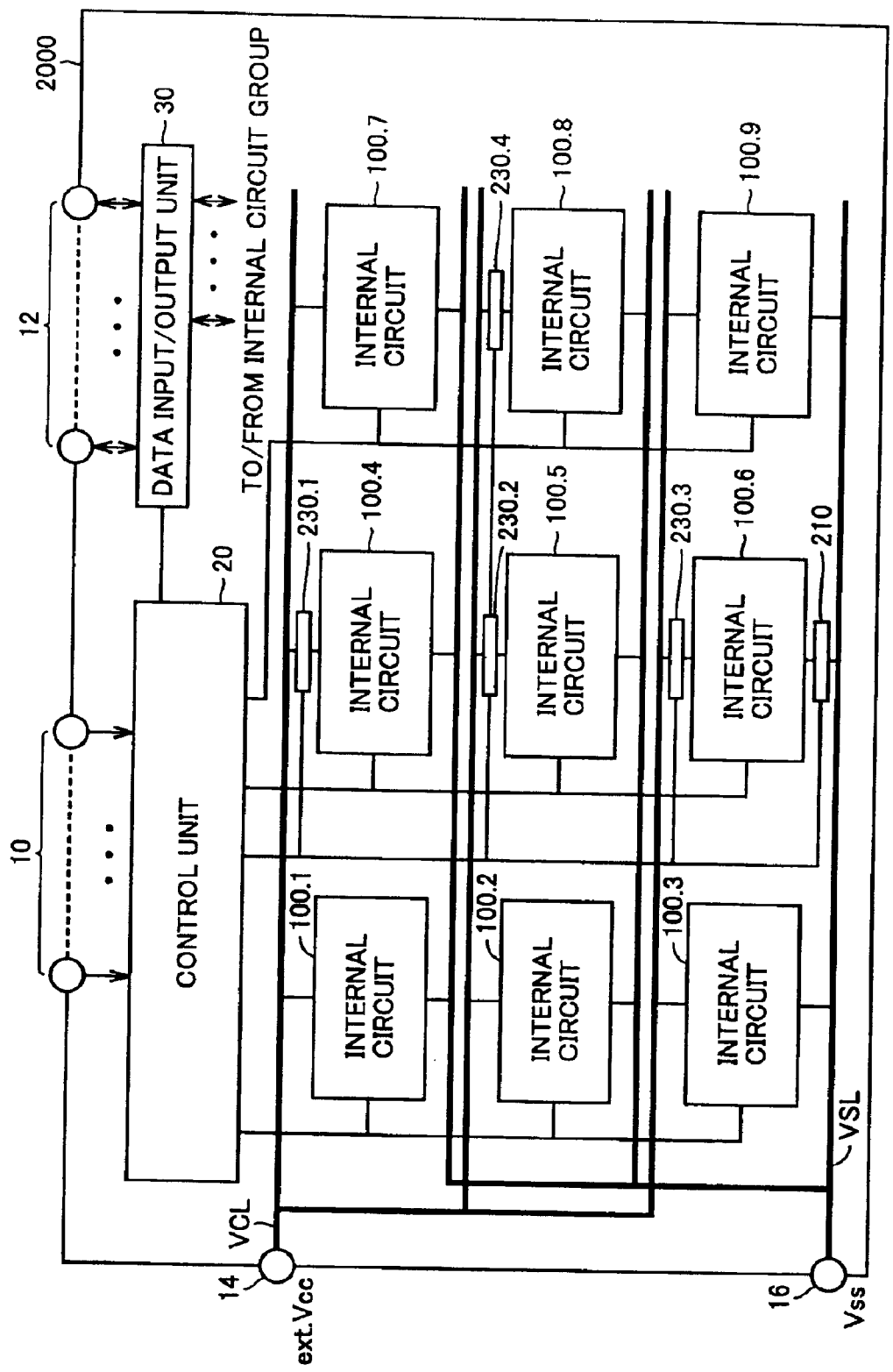
FIG. 9 is a schematic block diagram illustrating a configuration of a semiconductor integrated circuit device 2000 according to a second embodiment of the present invention.

FIG. 9 shows a configuration of the semiconductor integrated circuit device 2000 according to the second embodiment of the present invention.

Semiconductor integrated circuit device 2000 differs from semiconductor integrated circuit device 1000 shown in FIG. 1 in that every internal power supply circuit provided between the corresponding internal circuit and power supply interconnection VCL has the same configuration as internal power supply circuit 230 shown in FIG. 4.

The internal power supply circuits configured as described above makes it possible to simplify the configuration of the measuring unit 54 in internal power supply test circuit 50, as described below. Further, in the present embodiment, the latch circuit for holding test results during the testing operation is configured to also operate in the normal operation to store and hold data from internal circuits 100.1–100.9.

Figure 10:
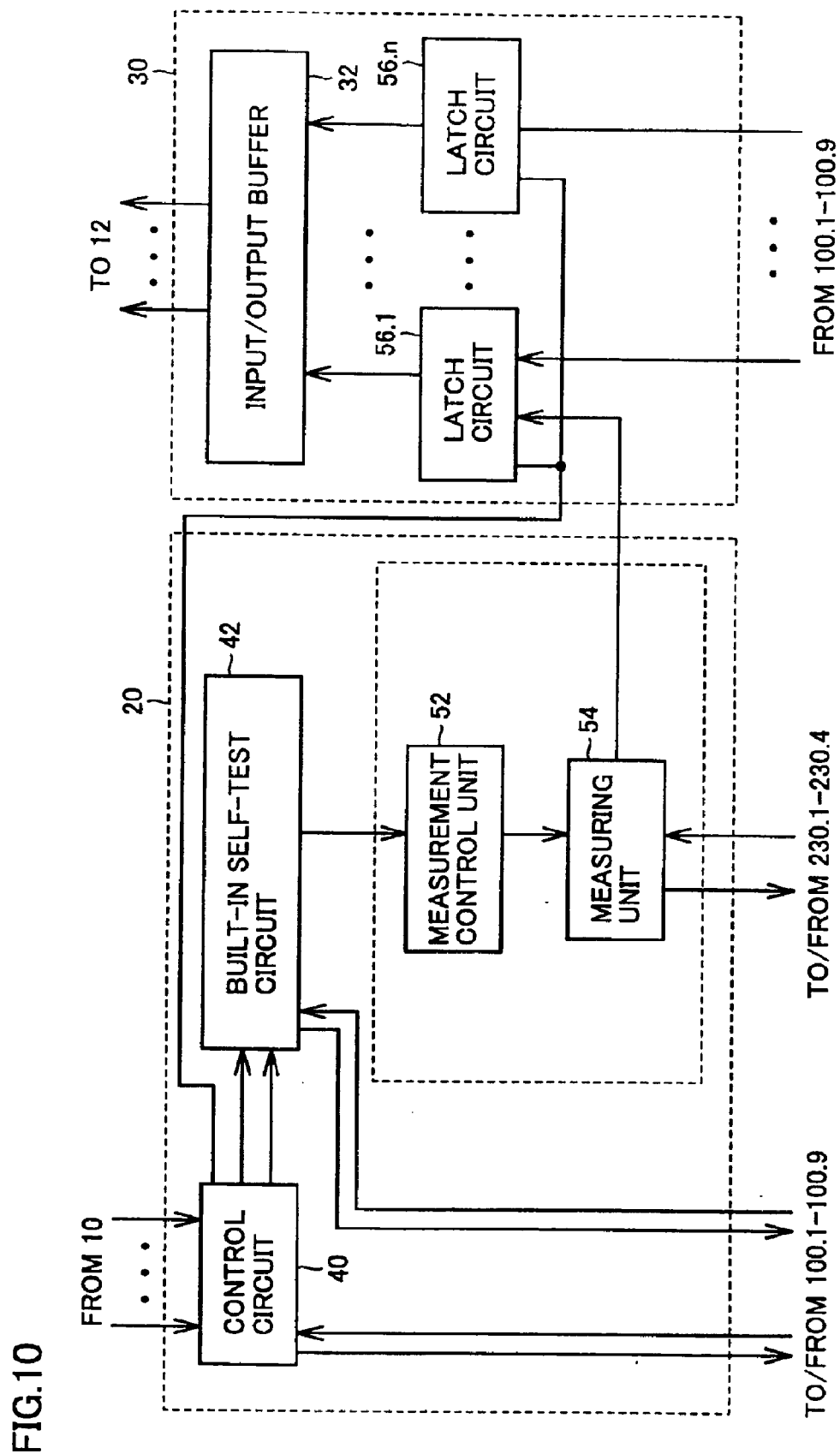
FIG. 10 is a schematic block diagram illustrating configurations of the control unit 20 and data input/output unit 30 of the second embodiment.

FIG. 10 schematically shows configurations of control unit 20 and data input/output unit 30 of the second embodiment.

The configurations of the second embodiment differ from those of the first embodiment shown in FIG. 5 in that a latch circuit 56.1 has an additional function to serve as an output data latching circuit when performing data input/output in the normal operation. Thus, in the testing operation, latch circuit 56.1 takes in the output from measuring unit 54 that detects the supply current value of internal power supply circuit 230. In this testing operation, the output of measuring unit 54 is taken into latch circuit 56.1 at a timing controlled by control circuit 40, as in a normal reading operation.

In the normal reading operation, data from internal circuit group 100.1–100.9 are taken into latch circuits 56.1–56.n (n is a natural number) at a timing controlled by control circuit 40.

Thus, by employing latch circuit 56.1 both in the normal and testing operations, the circuit configuration is simplified and also the increase in the number of pins required for data input/output is restricted.

Figure 11:
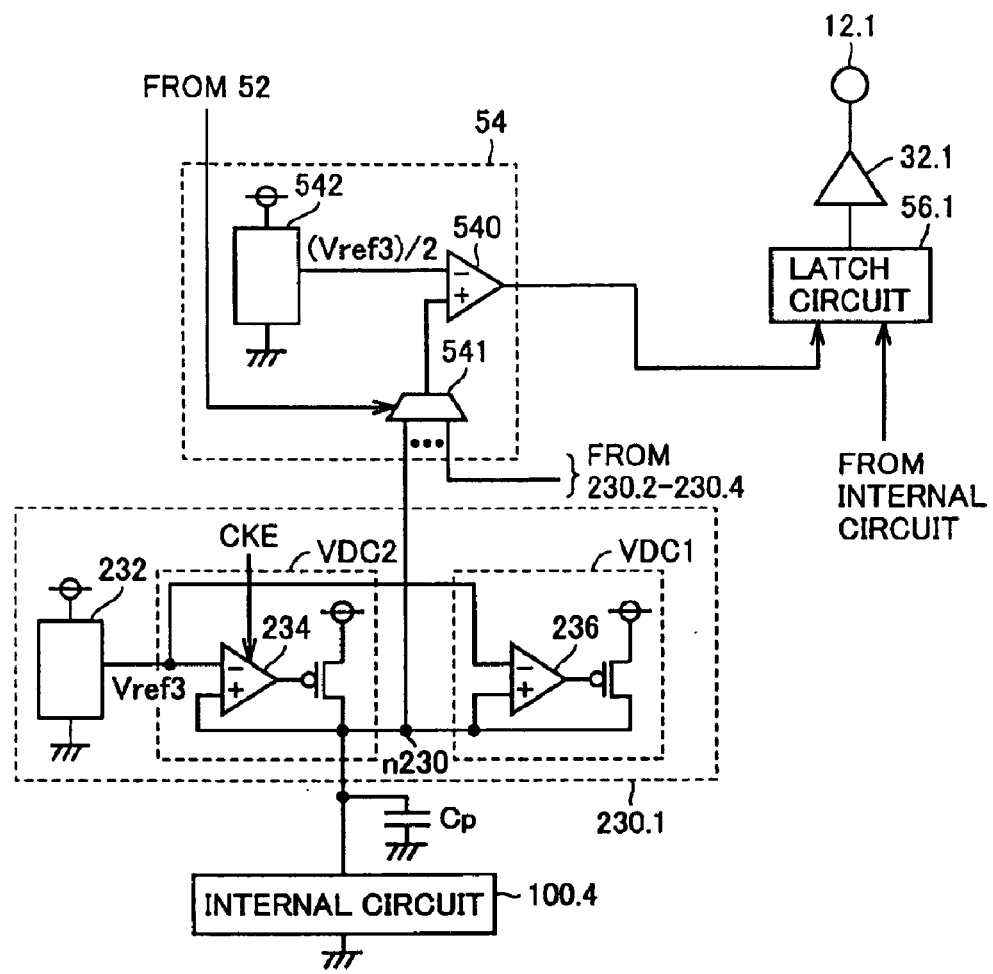
FIG. 11 is a schematic block diagram selectively illustrating configurations of the internal power supply circuit 230.1, measuring unit 54, latch circuit 56.1 and input/output buffer 32.

FIG. 11 selectively shows configurations of internal power supply circuit 230.1 shown in FIG. 9, and measuring unit 54 within control unit 20 for measuring the operating current values of internal power supply circuits 230.1–230.4, latch circuit 56.1, and input/output buffer 32 shown in FIG. 10.

Measuring unit 54 includes: a multiplexer 541 for selectively transmitting the potentials of internal nodes n230 in internal power supply circuits 230.1–230.4; a reference potential generating circuit 542 for generating a reference potential (Vref3)/2; and a comparator 540 for comparing a potential of node n230 of the internal power supply circuit as a target of measurement that is provided via multiplexer 541 with the reference potential (Vref3)/2.

As described in conjunction with FIG. 4, in internal power supply circuit 230, voltage converting unit VDC1 operating during standby is configured in advance such that it has a small current supplying capability.

Thus, the potential level of node n230 is maintained by the supply current of the voltage converting unit VDC1 for use during standby, as long as the leakage current occurring in the corresponding internal circuit is not greater than a prescribed amount.

However, in the case where there is a defect in the corresponding internal circuit 100.4 and the leakage current therein becomes greater than the prescribed value and exceeds the maximum current supplying capability of the voltage converting unit VDC1 for use during standby, then the internal power supply potential being supplied from node n230 cannot be maintained at the reference potential level of Vref3 and comes to decrease.

Thus, measuring unit 54 uses comparator 540 to compare the potential level of node n230 with a prescribed potential level, e.g., reference potential Vref/2, to detect occurrence of a leakage current exceeding a permissible value.

In the configuration shown in FIG. 11, the potential level (Vref3)/2 has been supplied to comparator 540 as the reference potential for comparison. However, any other reference value may be employed instead thereof.

Further, in the configuration shown in FIG. 11, comparator 540 receives the potential of node n230 at its input and compares the potential level with the reference potential. However, it may be configured to compare currents directly, instead of comparing the voltages.

The detected result is input to latch circuit 56.1 for use in data output, and then output via output buffer 32.1 to a prescribed terminal 12.1 among data input/output terminal group 12.

With the configuration described above, the effects as in the semiconductor integrated circuit device 1000 of the first embodiment can be achieved while restricting the circuit scale.

Third Embodiment

Figure 12:
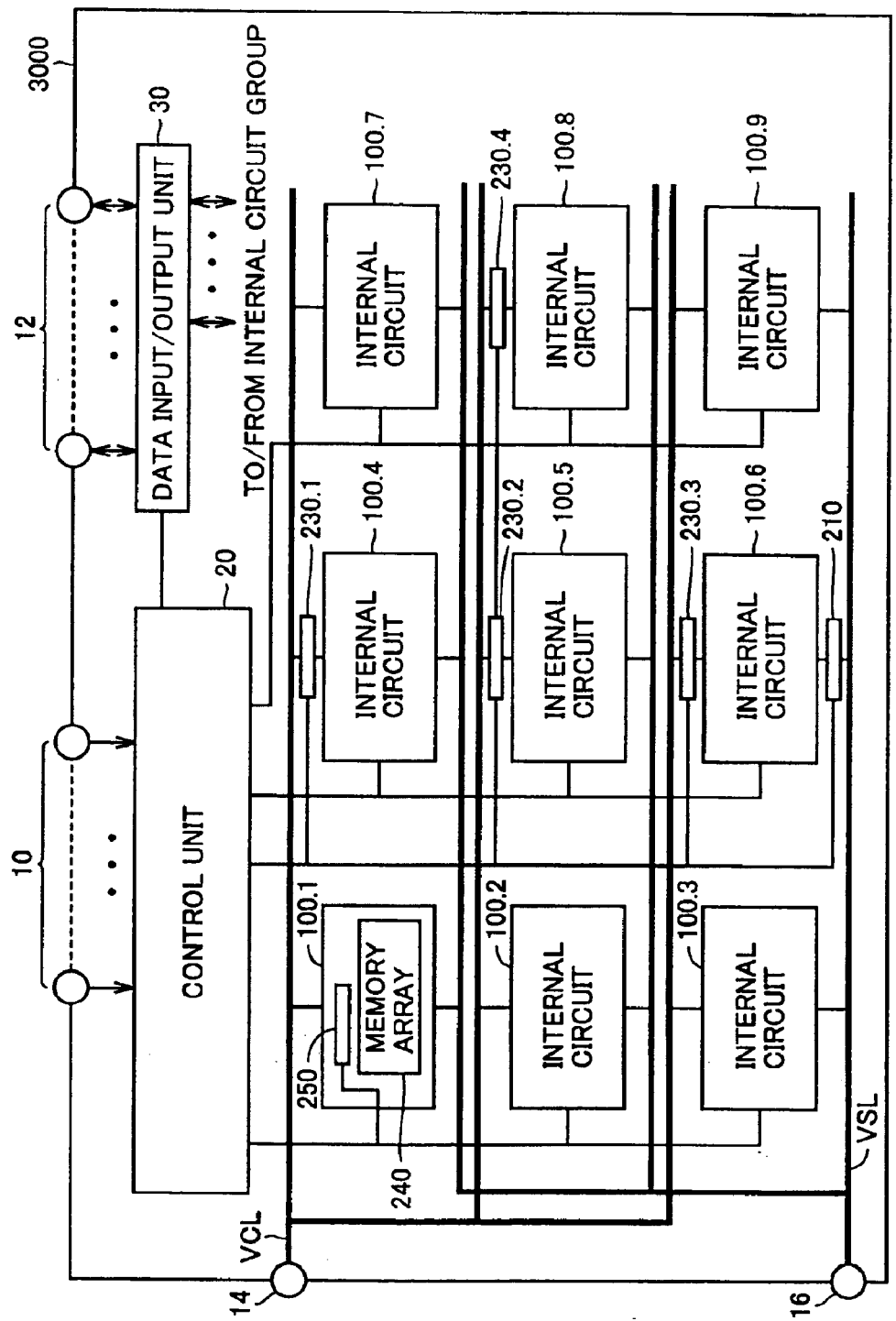
FIG. 12 is a schematic block diagram illustrating a configuration of a semiconductor integrated circuit device 3000 according to a third embodiment of the present invention.

FIG. 12 schematically shows the configuration of the semiconductor integrated circuit device 3000 according to the third embodiment of the present invention.

Semiconductor integrated circuit device 3000 differs from semiconductor integrated circuit device 2000 of the second embodiment shown in FIG. 9 in that at least one internal circuit 100.1 within internal circuit group 100.1–100.9 is a memory circuit, and the result of measurement of measuring unit 54 is temporarily stored in its memory cell array 240 before being externally read out.

Internal circuit 100.1 thus includes memory cell array 240 and a memory control circuit 250 for controlling data input/output with respect to memory cell array 240 or the like under the control of control unit 20.

Figure 13:
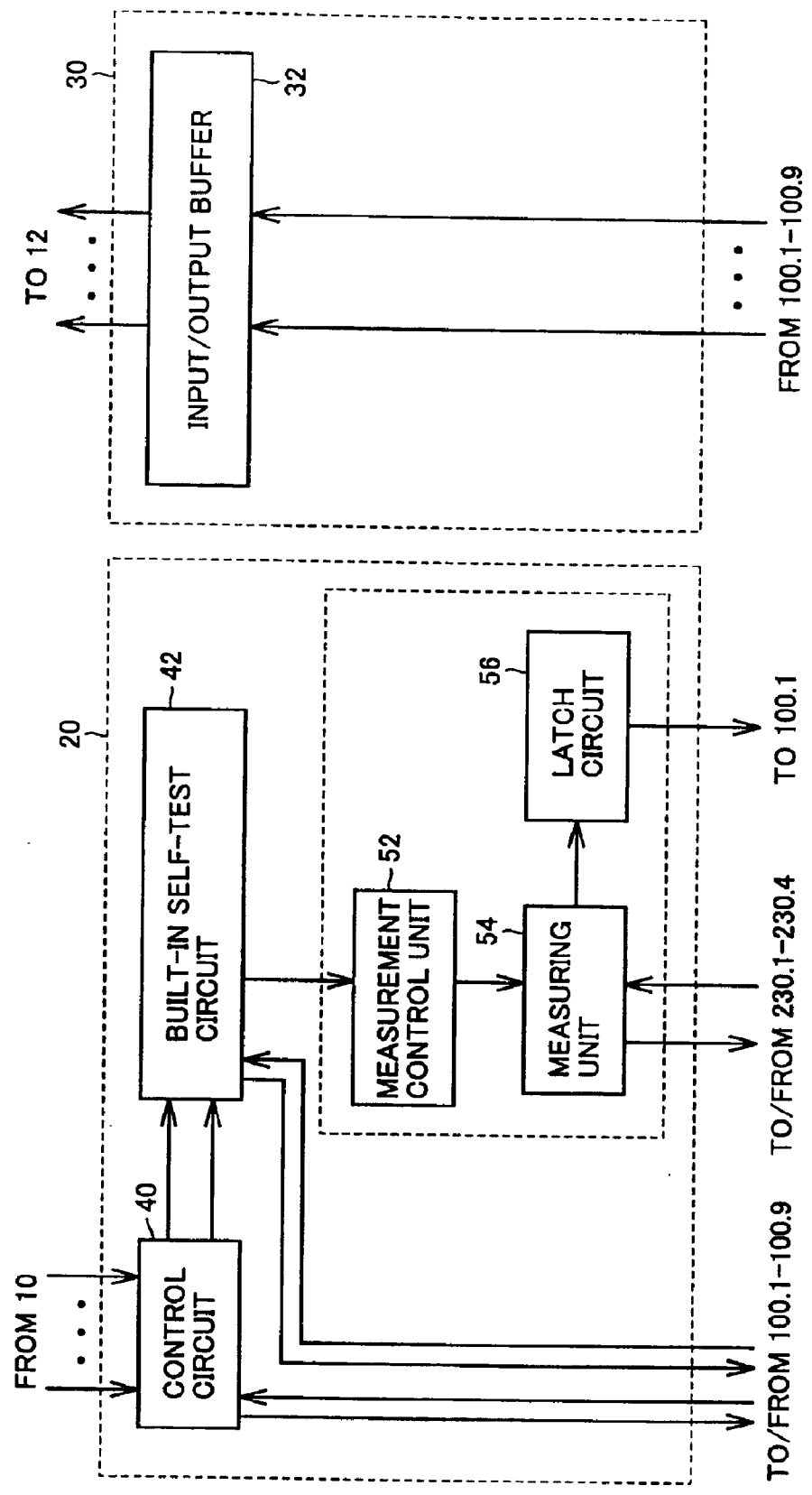

FIG. 13 selectively shows configurations of control unit 20 and data input/output unit 30 in semiconductor integrated circuit device 3000 shown in FIG. 12, for testing the current amounts supplied from internal power supply circuits 230.1–230.4 to internal circuits 100.4, 100.5, 100.6 and 100.8.

The configurations shown in FIG. 13 differ from the configurations of control unit 20 and data input/output unit 30 of the second embodiment shown in FIG. 10 in that the result of measurement of the internal power supply circuits by measuring unit 54 are written via latch circuit 56 to memory cell array 240 within internal circuit 100.1.

The data of the test results stored in memory cell array 240 are read from input/output buffer 32 as in the normal reading operation.

Figure 14:
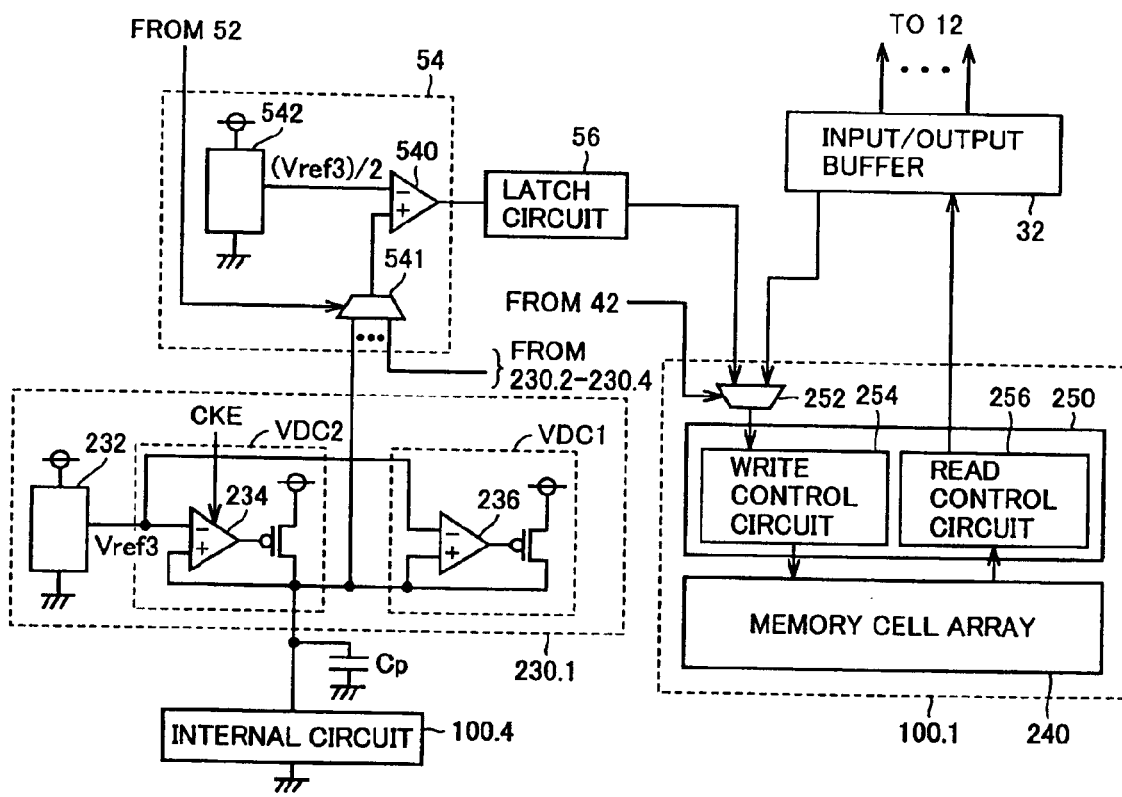
FIG. 14 is a schematic block diagram selectively illustrating configurations of the internal power supply circuit 230.1, measuring unit 54, latch circuit 56, memory control circuit 250, and memory cell array 240.

FIG. 14 selectively shows, from the configurations shown in FIGS. 12 and 13, configurations of internal power supply circuit 230.1, measuring unit 54, lath circuit 56, and memory control circuit 250 and memory cell array 240.

During the testing operation, signal CKE is at an L level, so that comparator 234 within voltage converting circuit VDC2 is in an inactive state. That is, only the voltage converting circuit VDC1 for use in supplying a current during standby is operating during the test.

Comparator 540 compares the potential level of node n230 with a reference potential, e.g., potential level (Vref3)/2, and outputs the result to latch circuit 56.

The data held in latch circuit 56 regarding the leakage current of internal circuit 100.4 corresponding to internal power supply circuit 230.1 are then written into memory cell array 240 via multiplexer 252 controlled by built-in self-test circuit 42 and a write control circuit 254 within memory control circuit 250.

When such a testing operation is completed for every internal power supply circuit 230.1–230.4, the data of the test results stored in memory cell array 240 are output to data input/output terminal group 12 via a read control circuit 256 within memory control circuit 250 and buffer circuit 32.

In a normal operation, the data from input/output buffer 32 are written into memory cell array 240 via multiplexer 252 and write control circuit 254.

With such a configuration, again, the effects as in semiconductor integrated circuit device 2000 of the second embodiment can be achieved.

Fourth Embodiment

Figure 15:
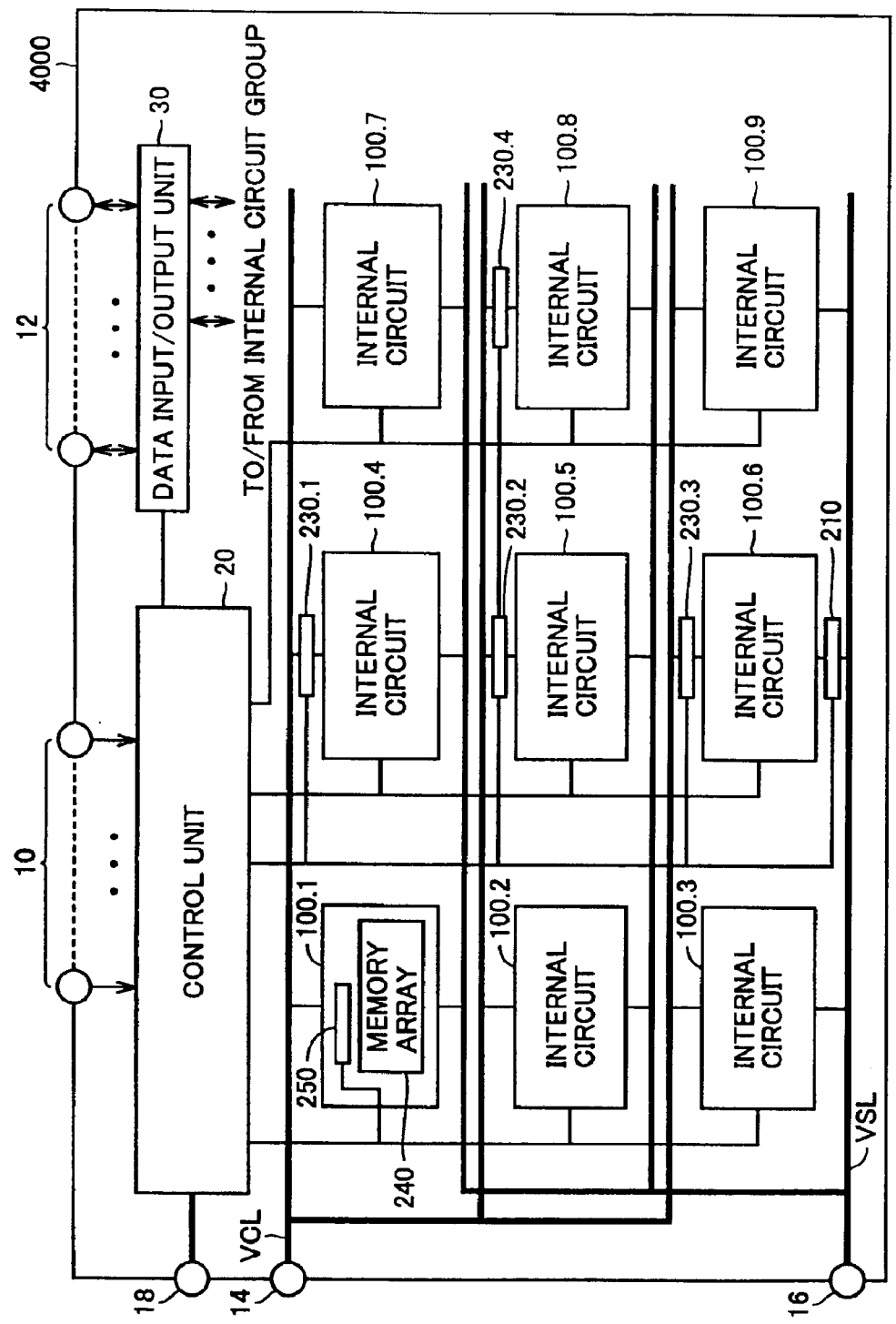
FIG. 15 is a schematic block diagram illustrating a configuration of a semiconductor integrated circuit device 4000 according to a fourth embodiment of the present invention.

FIG. 15 schematically shows a configuration of the semiconductor integrated circuit device 4000 according to the fourth embodiment.

Semiconductor integrated circuit device 4000 of the present invention differs from semiconductor integrated circuit device 3000 of the third embodiment in that a reference current for use in testing is supplied via a test terminal 18 to control unit 20. The configuration of voltage converting circuit VDC1 for supplying the operating current during standby within the internal power supply circuit also differs, as will be described later.

Otherwise, the configuration of semiconductor integrated circuit device 4000 of the fourth embodiment is identical to that of semiconductor integrated circuit device 3000 of the third embodiment, and therefore, the same or corresponding portions are denoted by the same reference character, and description thereof is not repeated.

Figure 16:
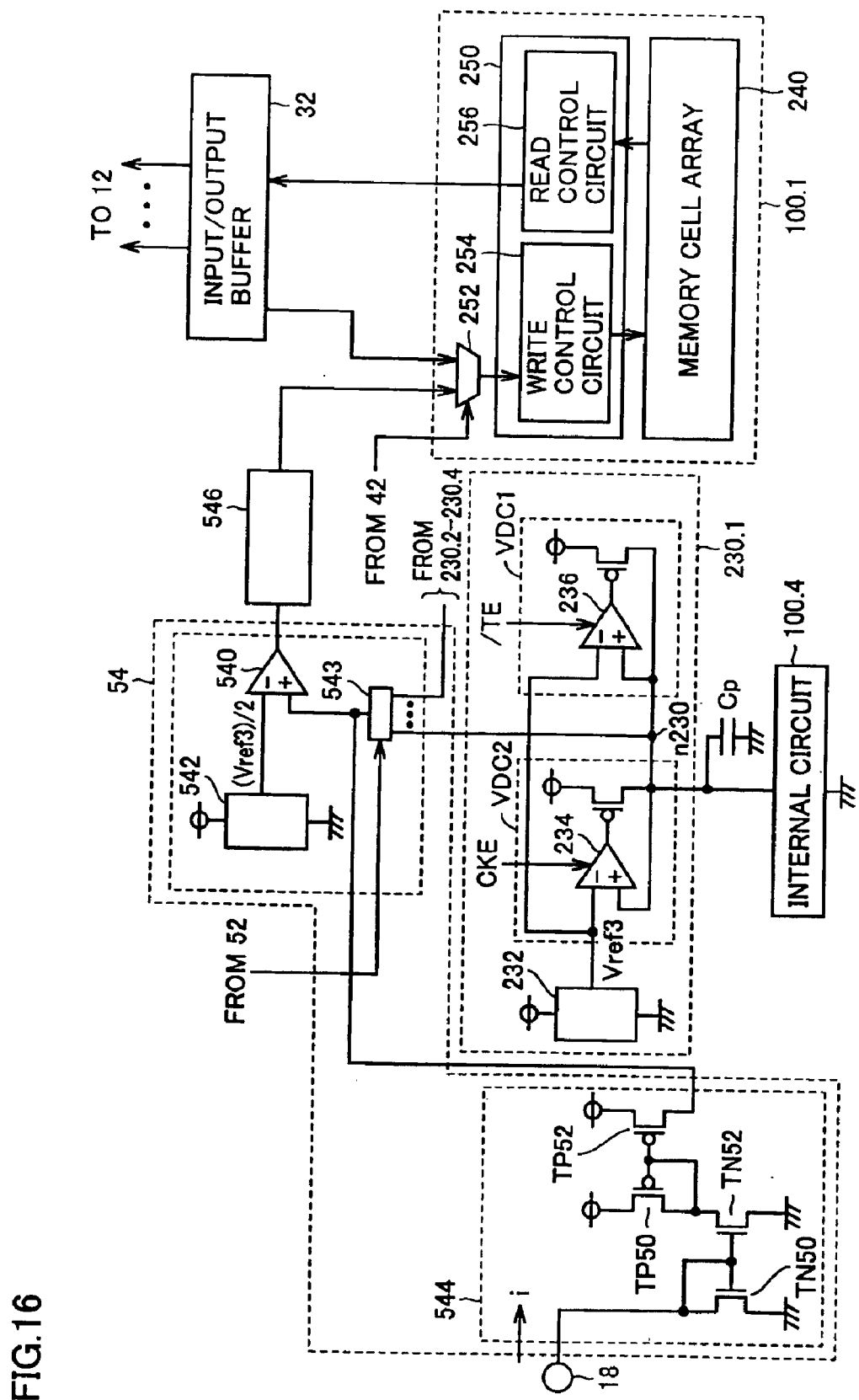
FIG. 16 is a schematic block diagram illustrating configurations of the internal power supply circuit 230.1 and measuring unit 54 within the configuration shown in FIG. 15.

FIG. 16 schematically shows the configurations of internal power supply circuit 230.1 and measuring unit 54 shown in FIG. 15.

In the configuration shown in FIG. 16, for the determination of the leakage level of internal circuit 100.4 corresponding to internal power supply circuit 230.1, the current supplying capability of a current source operating according to current value i supplied from test terminal 18 is utilized, instead of the current supplying capability of voltage converting circuit VDC1 for use during standby.

Specifically, in the present embodiment, control signal/TE being output from control unit 20 attains an inactive state during the test mode for testing the leakage current, and voltage converting circuit VDC1 for use during standby is also inactivated. Instead thereof, measuring unit 54 is provided with: a current mirror circuit 544 for supplying the current i being applied to terminal 18 to node n230; a reference potential generating circuit 542 for generating a reference potential of, e.g., potential level (Vref3)/2; a comparator 540 for comparing the potential level of node n230 with reference potential (Vref3)/2; and a switching circuit 543 controlled by measurement control unit 52 for selectively coupling internal node n230 of the internal power supply circuit as a target of measurement with a plus input node of comparator 540.

Current mirror circuit 544 includes: an N channel MOS transistor TN50 provided between terminal 18 and ground potential Vss; a P channel MOS transistor TP50 and an N channel MOS transistor TN52 that are connected in series between external power supply potential ext.Vcc and ground potential Vss; and a P channel MOS transistor TP52 provided between external power supply potential ext.Vcc and the plus input node of comparator 540.

Transistor TN50 has its gate coupled to terminal 18. Transistors TN50 and TN52 have their gates cross-coupled to each other.

A connect node of transistors TP50 and TN52 is coupled to the gates of transistors TP50 and TP52.

The current i externally input via terminal 18 is supplied via current mirror circuit 544 formed of transistors TN50, TN52, TP50 and TP52, and via switching circuit 543, to node n230 of the internal power supply circuit as the target of measurement.

For example, if there is no leakage in internal circuit 100.4 corresponding to internal power supply circuit 230.1, the potential level of node n230 is maintained with the current amount i being supplied.

On the contrary, if there is a leakage current in internal circuit 100.4, although the potential level of node n230 is maintained while the leaked amount is smaller than the current amount i being supplied, the potential level of node n230 comes to decrease once the leakage current exceeds the current amount i being supplied.

Thus, comparing the potential level of node n230 with reference potential (Vref3)/2 by comparator 540 makes it possible to test the state of leakage in the corresponding internal circuit.

Further, by altering the current amount i externally supplied, even the amount of the leakage in the internal circuit can be determined.

In the present embodiment, a data converting circuit 546 is provided instead of latch circuit 56 in FIG. 14.

In the case where the output level of comparator 540 is being successively stored in memory cell array 240 while current value i is altered sequentially, the data writing can be conducted while providing from the tester side an address signal for selecting a memory cell in memory cell array 240 to which data is to be written. In such a case, the latch circuit holding the output of comparator 540 as in FIG. 14 will suffice for the data converting circuit 546.

By comparison, assume the case, as described later, where data representing a change point at which the output level of comparator 540 changes while current value i is sequentially altered is coded and stored in memory cell array 240. In such a case, data converting circuit 546 needs to be configured such that it can receive from built-in self-test circuit 42 the coded data showing the current value i being output from the tester, and write the coded data to memory cell array 240.

Figure 17:
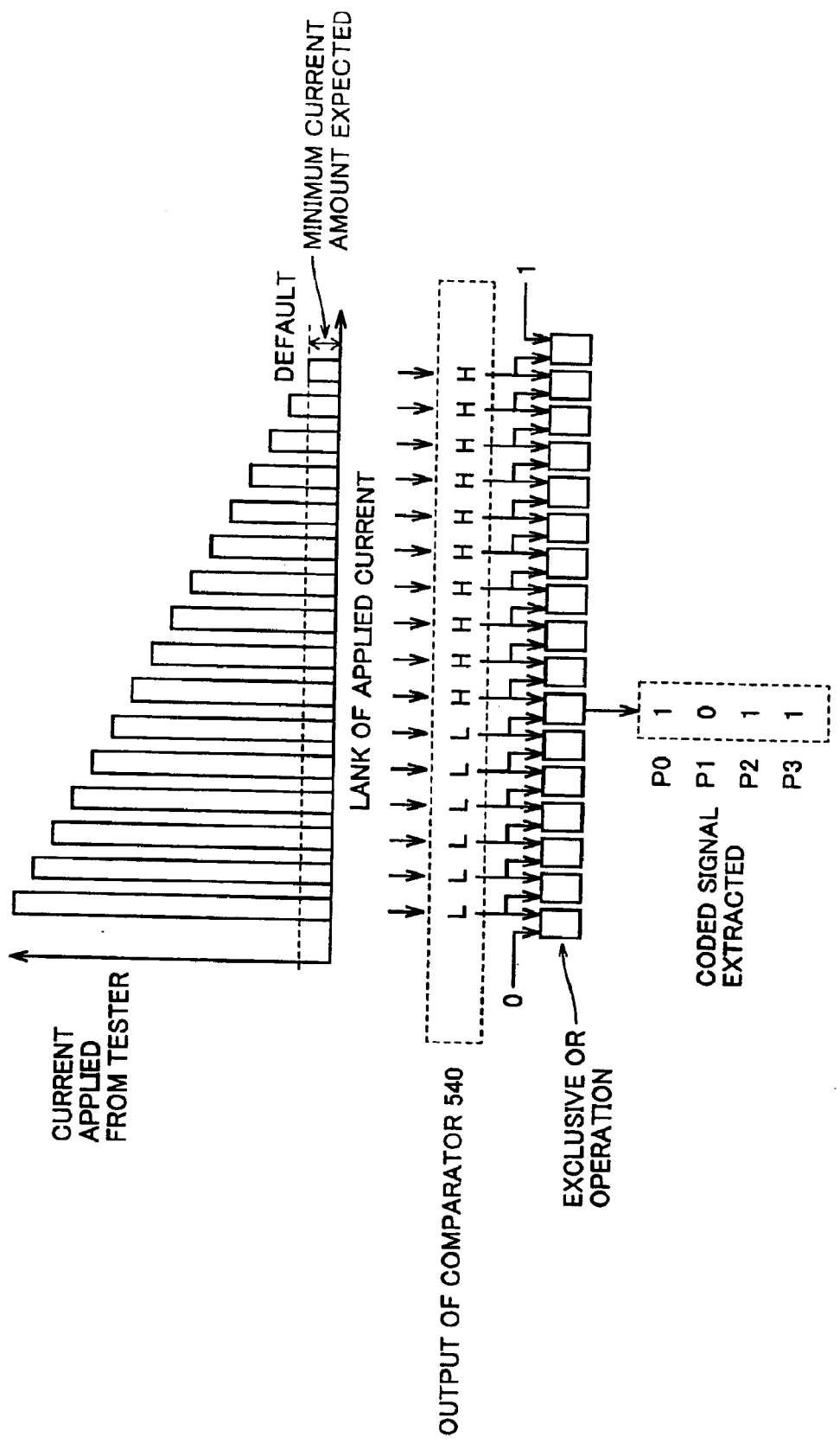
FIG. 17 schematically illustrates a procedure for detecting a leakage current amount generated in an internal circuit to be tested, e.g., the internal circuit 100.4.

FIG. 17 schematically illustrates the procedure for detecting the amount of leakage current occurring in the internal circuit to be tested, e.g., internal circuit 100.4, employing the current amount i being externally supplied, as described above.

The externally supplied current value i for comparison is sequentially altered from the default value, and every time the value is changed, it is tested whether the potential level of internal node n230 is maintained. If the leakage current in the internal circuit is smaller than the input current, and the potential level of internal node n230 is being maintained, then the output of comparator 540 is at an L level. On the contrary, if the leakage current is great and the potential level of node n230 cannot be maintained, the output of comparator 540 attains an H level.

Thus, through the test being conducted while the externally supplied current value i is sequentially changed from a smaller value, an H level will be initially output as the test result, which will change to an L level at a time point when current value i has reached a certain value.

As a way of storing these results in the memory, the comparison results of comparator 540 corresponding to sequentially changed current values i may be stored accordingly.

However, in order to lessen the data amount being stored in the memory, the current value i at the change point where the output level of comparator 540 makes a change can be coded, and the coded value may be stored in the memory.

FIG. 17 illustrates the procedure for detecting such a change point by calculating an exclusive OR of the output level of comparator 540 at a present stage and the output level of comparator 540 at a preceding stage.

Here, the exclusive OR of logical value "1" and the output level of comparator 540 is calculated when current value i takes the default value. When current value i takes the maximum value, the exclusive OR of logical value "0" and the output level of comparator 540 is calculated.

The built-in self-test circuit 42 codes and outputs information as to what stage each externally supplied current value i corresponds to. Accordingly, in the case where current value i changes in 16 stages, and the coded signal at the change point of the output level of comparator 540 is expressed as (P3, P2, P1, P0)=(1101), then the data "1101" can be stored in memory cell array 240.

Figure 18:
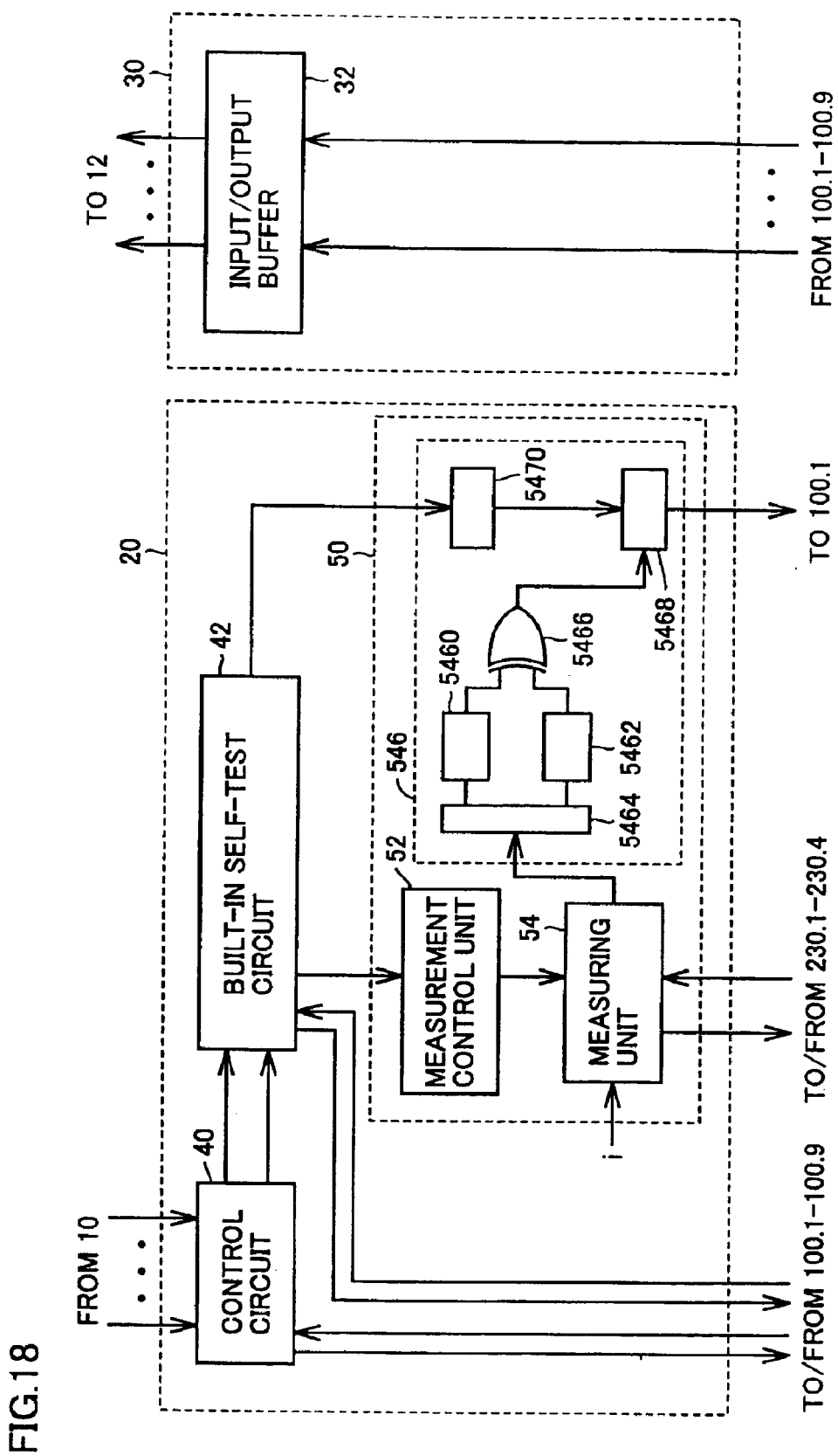
FIG. 18 is a schematic block diagram illustrating a configuration of the data converting circuit 546.

FIG. 18 schematically shows the configuration of data converting circuit 546 for coding and writing to memory cell array 240 the point at which the output level of comparator 540 changes while current value i is sequentially altered.

Described hereinafter is the case where externally supplied current value i is changed from the default value in 16 stages, as described above.

For searching the point where the output level of comparator 540 changes while current value i is sequentially altered, there should exist both the comparison result of comparator 540 with current value i at the preceding stage and the comparison result of comparator 540 with current value i at the present stage.

Accordingly, data converting circuit 546 includes: a first latch circuit 5460; a second latch circuit 5462; and a switching circuit 5464 for writing the output from comparator 540, every time the level of current value i changes, alternately to first and second latch circuits 5460 and 5462. Specifically, switching circuit 5464 stores the comparison result data to latch circuits 5460 and 5462 by interleaving. Note that, when the initial comparison data is being obtained, an H level is forcibly stored in first latch circuit 5460, and the comparison result data for the default value of current value i is stored in second latch circuit 5462.

The data thus stored in two latch circuits 5460 and 5462 are applied to an exclusive OR circuit 5466. While exclusive OR circuit 5466 sequentially performs the exclusive OR operation, a transfer gate 5468 is activated at the time when the logical level makes a change.

A latch circuit 5470 stores the coded signal output from built-in self-test circuit 42 indicating the stage number of current value i at the present stage. Transfer gate 5468 receives the output from latch circuit 5470, and at the time when the output level of exclusive OR circuit 5466 attains the active state, outputs the data stored in latch circuit 5470 to memory cell array 240.

When the measurement is conducted with the current value i being altered in 16 stages, the levels of current value i can be identified with combinations of four bits of signals. Thus, all that is needed to be stored in memory cell array 240 is these four bits.

If the output level of exclusive OR circuit 5466 is at an H level for current value i of the default value, then it can be said that the internal circuit corresponding to the internal power supply circuit being tested suffers a small leakage current.

By comparison, if the output level of exclusive OR circuit 5466 does not change to an L level until the current value i reaches the last stage, it can be said that the amount of the leakage current in the internal circuit corresponding to the internal power supply circuit being tested is extremely large.

First Variation of Fourth Embodiment

In the fourth embodiment, the reference current i for comparison was supplied from the external tester via terminal 18 for testing the magnitude of the current value being supplied from an internal power supply circuit to the corresponding internal circuit.

The first variation of the fourth embodiment is configured to generate the reference current within measuring unit 54.

Figure 19:
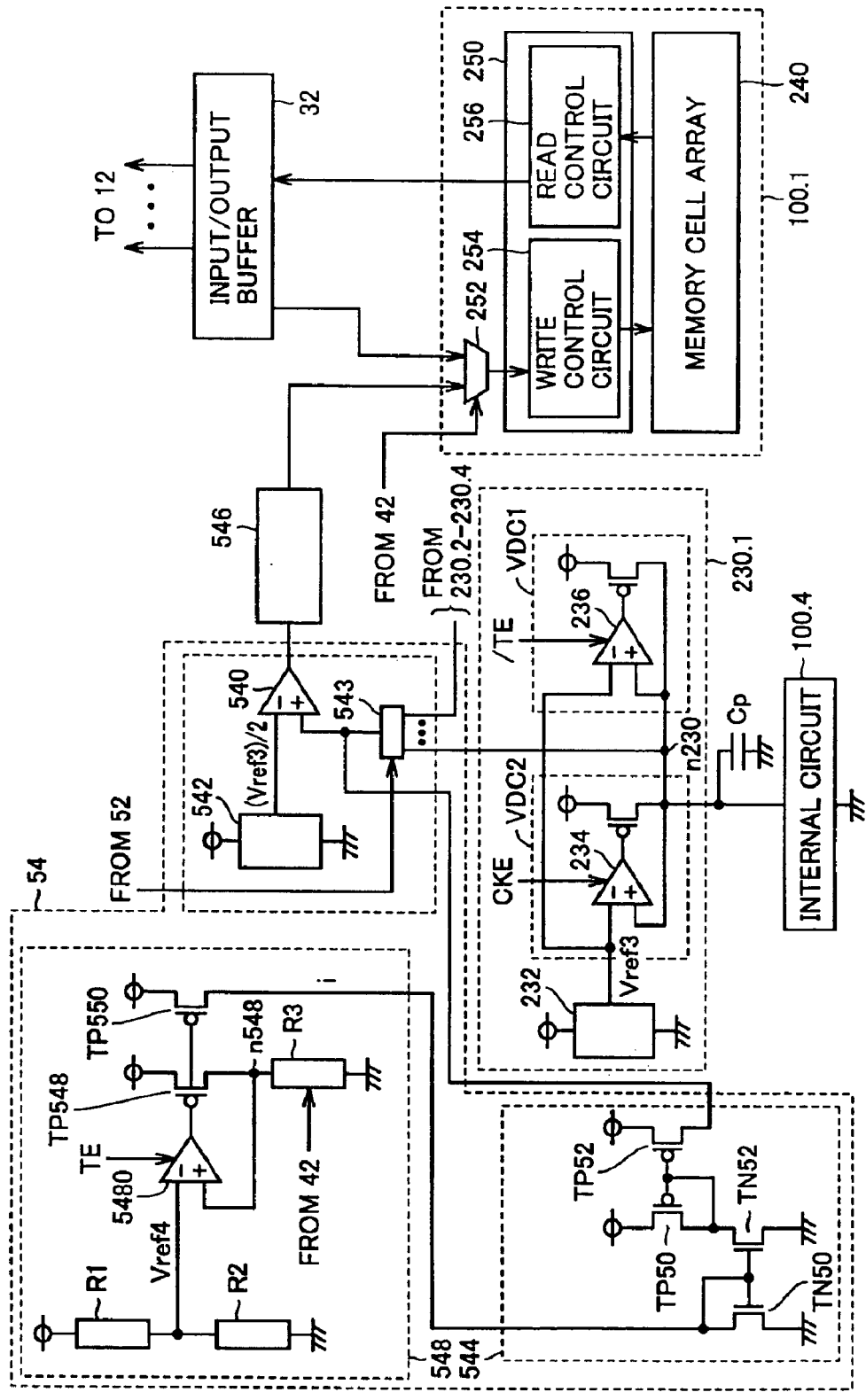
FIG. 19 is a schematic block diagram illustrating configurations of the internal power supply circuit 230.1 and measuring unit 54 according to a variation of the fourth embodiment.

FIG. 19 schematically shows the configurations of internal power supply circuit 230.1 and measuring unit 54 according to the first variation of the fourth embodiment.

Compared to the configuration shown in FIG. 16, measuring unit 54 shown in FIG. 19 is provided with an internal reference current generating circuit 548, and current mirror circuit 544 supplies the current value i output from the internal reference current generating circuit 548 to internal node n230.

Referring to FIG. 19, internal reference current generating circuit 548 includes: resistances R1 and R2 connected in series between power supply potential ext.Vcc and ground potential Vss; a comparator 5480 having a minus input node receiving a potential Vref4 of a connect node of resistances R1 and R2, and activated in response to activation of signal TE; a P channel MOS transistor TP548 provided between internal node n548 and power supply potential ext.Vcc and having its gate receiving the output level of comparator 5480; a variable resistance R3 connected between node n548 and ground potential Vss and capable of changing its resistance value according to a control signal output from built-in self-test circuit 42; and a P channel MOS transistor TP550 provided between the drain of transistor TN50 of current mirror circuit 544 and power supply potential ext.Vcc and having its gate receiving the output of comparator 5480. Node n548 is coupled to the plus input node of comparator 5480.

With such a configuration of internal reference current generating circuit 548, current value i=Vref4/R3 will be output from the drain of transistor TP550.

That is, reference current value i is changed in a plurality of stages of levels by altering the resistance value of variable resistance R3 according to the signal from built-in self-test circuit 42.

Figure 20:
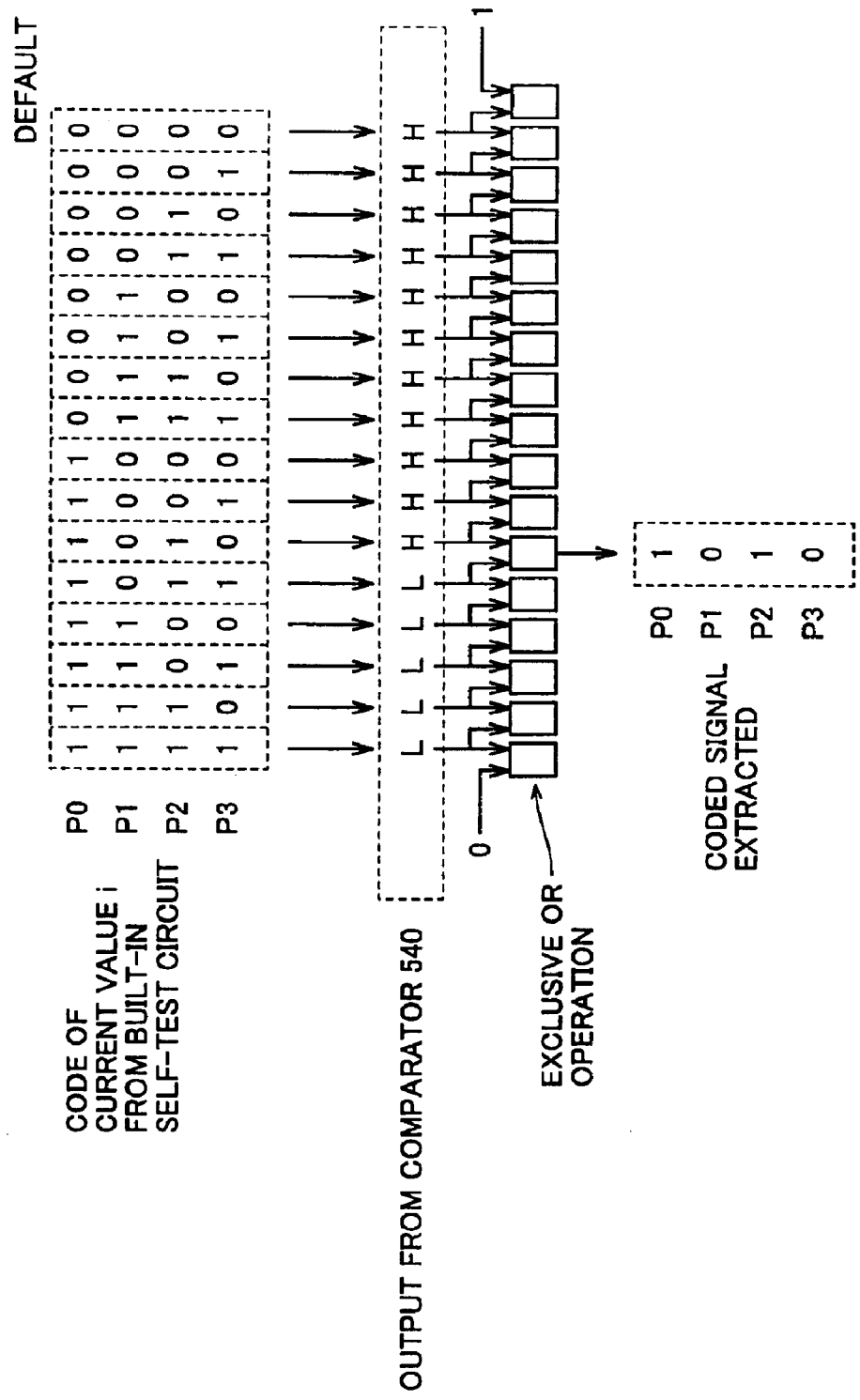
FIG. 20 schematically shows an example of the code output from the built-in self-test circuit 42.

FIG. 20 schematically illustrates the codes being output from built-in self-test circuit 42.

Herein, it is assumed that signals of four bits are generated from built-in self-test circuit 42 to represent the reference current in 16 stages.

Current value i of the reference current is sequentially changed, and the exclusive OR is taken for the comparison results of the present stage and of the preceding stage to extract the change point of the output level.

The 4-bit signal at the extracted point represents the magnitude of the leakage current. Accordingly, the combination of the bits is written into memory cell array 240 via the circuit configuration as in FIG. 18.

Second Variation of Fourth Embodiment

In the description above, the configuration in which an internal power supply circuit identical to internal power supply circuit 230 is provided between an internal circuit and power supply interconnection VCL has been explained.

However, in the case where the reference current value i is externally supplied or generated within measuring unit 54, it will be possible to conduct the test when a switch circuit, e.g., switch circuit SW20 shown in FIG. 6, is provided between power supply interconnection VCL and an internal circuit, instead of internal power supply circuit 230.

Figure 21:
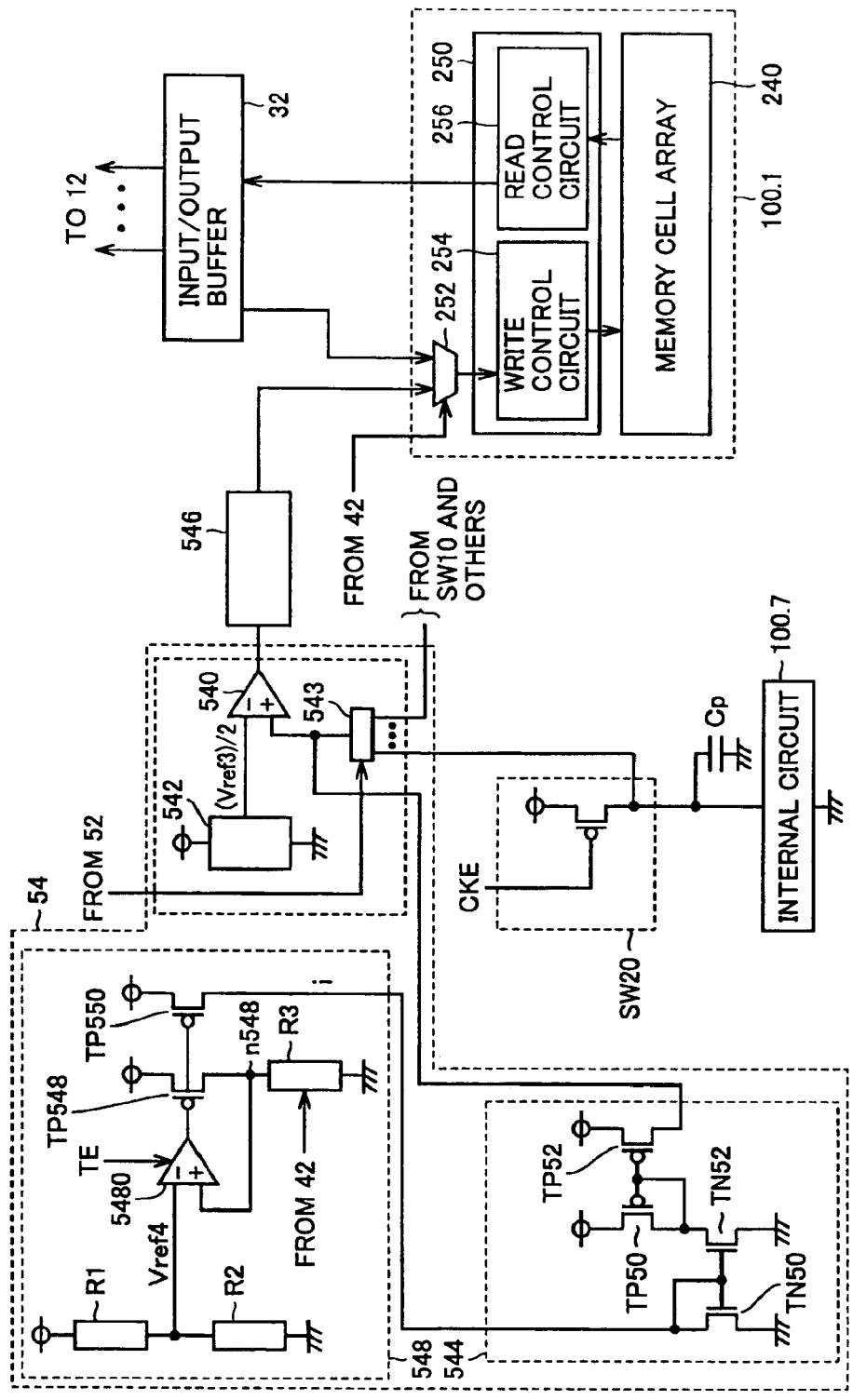
FIG. 21 illustrates a circuit configuration for testing a leakage current in an internal circuit.

FIG. 21 shows the circuit configuration for testing the leakage current of the internal circuit in such a case.

The configuration of FIG. 21 is identical to that of FIG. 19 except that internal power supply circuit 230 is replaced with a switch circuit SW20. Therefore, the same or corresponding portions are denoted by the same reference character, and description thereof is not repeated.

Figure 22:
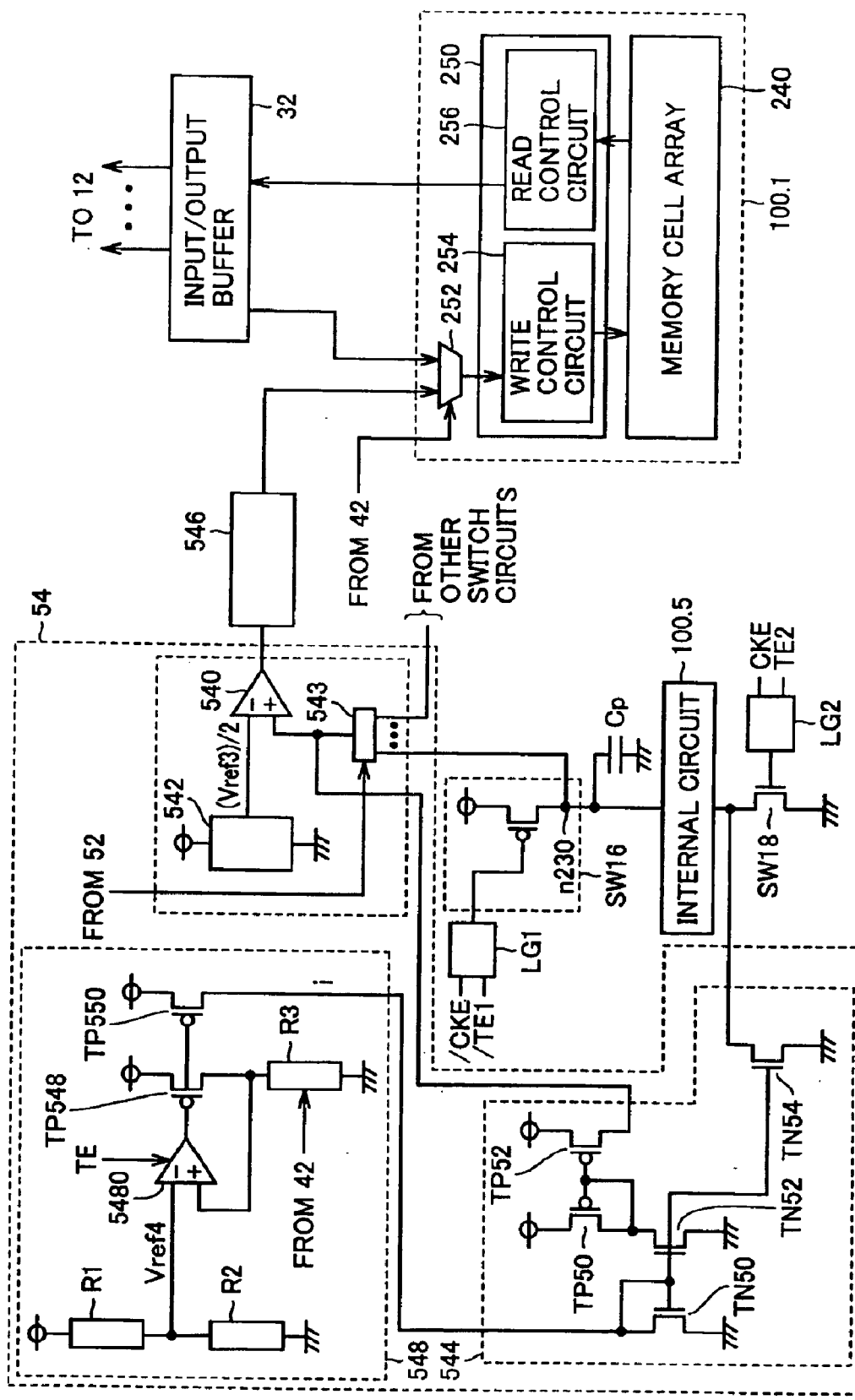
FIG. 22 is a schematic block diagram illustrating a configuration for measuring a leakage current.

FIG. 22 schematically shows another configuration for measuring the leakage current wherein, in addition to a switch circuit SW16 provided between power supply interconnection VCL and the internal circuit, another switch circuit, e.g., switch circuit SW18 shown in FIG. 6, is provided between the internal circuit and ground interconnection VSL.

As in the case of FIG. 21, the transistor of switch circuit SW16 or SW18 is set to an off state when measuring the leakage current, so that only the reference current is supplied to internal circuit 100.5. The magnitude of the leakage current can be determined by measuring the potential level of node n230 at this time.

To allow separate measurement of leakage at the power supply interconnection side and the ground interconnection side in the testing operation, a logic gate LG1 for control of the transistor of switch circuit SW16 at the power supply interconnection VCL side and a logic gate LG2 for control of switch circuit SW18 at the ground interconnection VSL side are provided.

Logic gate LG1 outputs a signal of an L level when signals /CKE and /TE1 output from control unit 20 both attain an L level.

Logic gate LG2 outputs a signal of an H level when signals CKE and TE2 output from control unit 20 both attain an H level.

Fifth Embodiment

Figure 23:
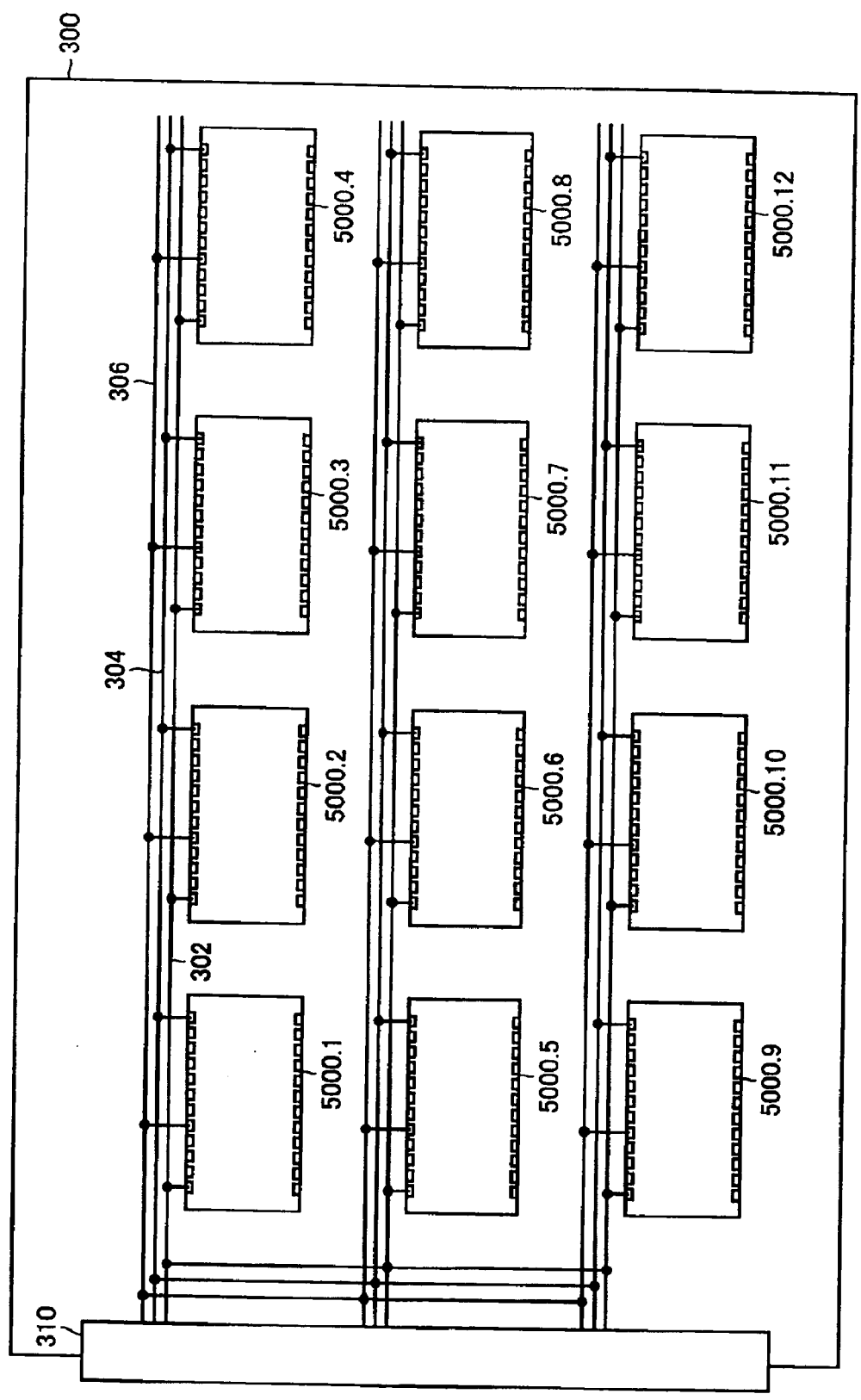
FIG. 23 schematically illustrates a configuration for testing, in a batch, a plurality of semiconductor integrated circuit devices mounted on the board 300.

FIG. 23 schematically shows a configuration for testing a plurality of semiconductor integrated circuit devices 5000.1–5000.12 in a batch by mounting them on a board 300.

Alternatively, it may be configured to use a wafer card as a tool for testing in a wafer test to simultaneously test the plurality of semiconductor integrated circuit devices.

In either case, the plurality of chips are commonly provided with a power supply potential level from a power supply line 302 on the board (or wafer card). The plurality of chips are also commonly provided with a ground level from a ground line 304 on the board (or wafer card), and control signals and data signals are transmitted thereto via a signal line 306 on the board (or wafer card). The power supply potential and the control signals are supplied from an external tester (not shown) to board 300 via an interface unit 310. The data signals are transmitted therebetween also via interface unit 310.

Here, if any one of the chips exhibits abnormal leakage, it may cause the potential level of power supply line 302 to vary, hindering accurate measurement of the other chips.

Figure 24:
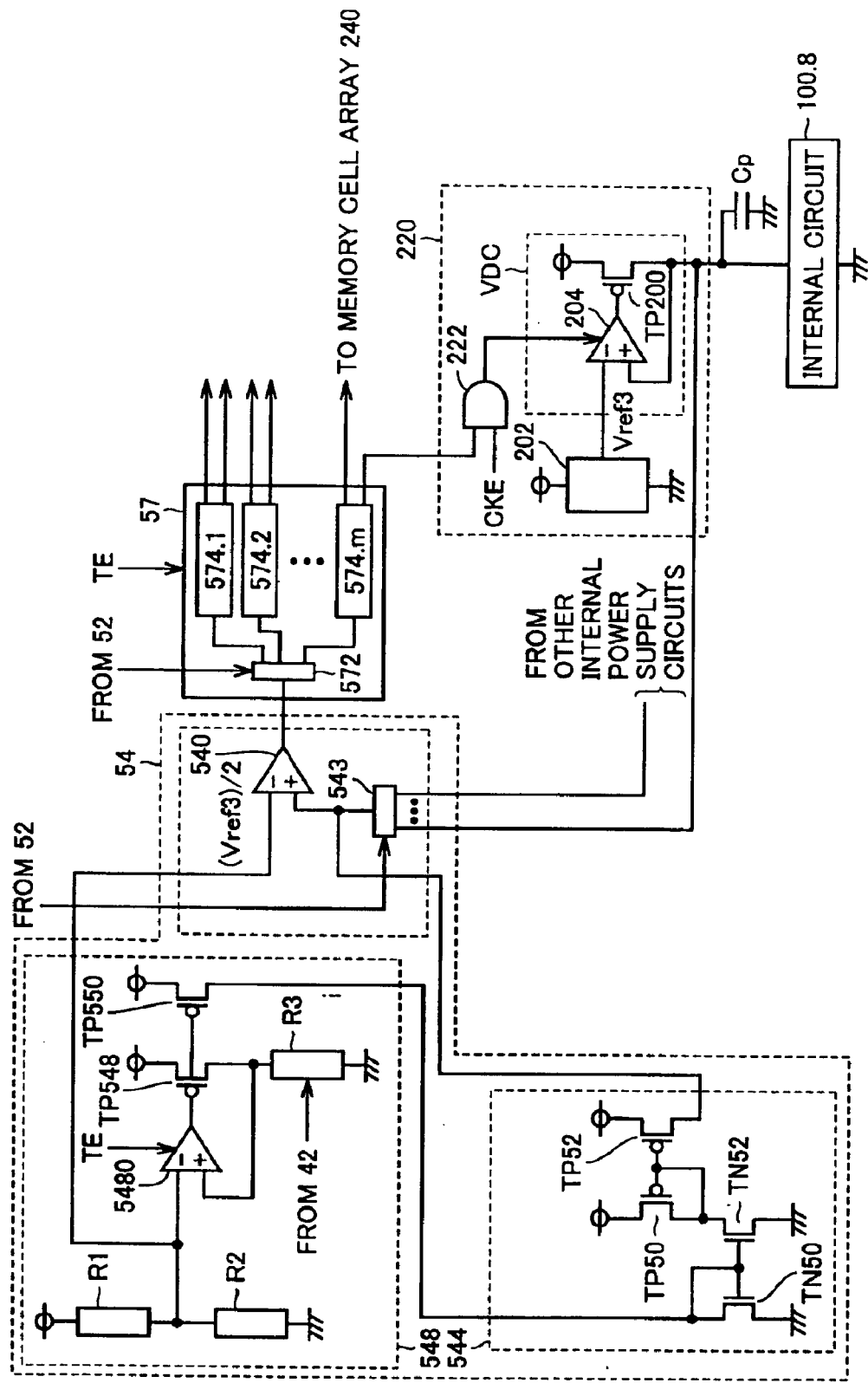
FIG. 24 is a schematic block diagram selectively illustrating configurations of the measuring unit 54, data holding circuit 57 and internal power supply circuit 220 of the semiconductor integrated circuit device 5000.1 according to a fifth embodiment of the present invention.

FIG. 24 schematically shows the configuration of measuring unit 54 within control unit 20 of semiconductor integrated circuit device 5000.1 among a plurality of semiconductor integrated circuit devices 5000.1–5000.12 mounted on board 300 in FIG. 23. The other semiconductor integrated circuit devices 5000.2–5000.12 each have the same configuration as semiconductor integrated circuit device 5000.1.

The configuration of semiconductor integrated circuit device 5000.1 is basically the same as the configuration of semiconductor integrated circuit device 3000 shown in FIG. 12.

It however differs from the configuration of semiconductor integrated circuit device 3000 shown in FIGS. 12–14 in the following points.

i) In the configuration of semiconductor integrated circuit device 3000 shown in FIG. 12, the internal power supply circuit placed between power supply interconnection VCL and an internal circuit was provided with both voltage converting circuits VDC1 and VDC2, as shown in FIG. 14.

By comparison, in semiconductor integrated circuit device 5000.1, the internal power supply circuit may be configured with a voltage converting circuit having just a single circuit system like, e.g., internal power supply circuit 200 shown in FIG. 2.

Thus, in semiconductor integrated circuit device 5000.1, the current i for measurement of the operating current value of the internal power supply circuit is supplied from measuring unit 54, as will be described later.

ii) In semiconductor integrated circuit device 5000.1, each internal power supply circuit is provided with a configuration for suspending the current supply from power supply interconnection VCL to the internal power supply circuit, regardless of activating signal CKE from control unit 20, when it is determined from the measurement result of the operating current that there is a large leakage current in the corresponding internal circuit.

iii) In FIGS. 13 and 14, the measurement result of measuring unit 54 about the internal power supply circuit as the target of measurement was stored in latch circuit 56 before being stored in memory cell array 240. Thus, latch circuit 56 was required to have a capacity enough to store the measurement result for one internal power supply circuit.

By comparison, in semiconductor integrated circuit device 5000.1, a latch circuit is provided for each internal power supply circuit as a target of measurement that can separately store the measurement result of the operating current. The aforementioned function to suspend the current supply from power supply interconnection VCL to the internal power supply circuit is effected based on the data stored in the separate latch circuits.

FIG. 24 selectively illustrates the configurations of measuring unit 54, a data holding circuit 57 and internal power supply circuit 220 of semiconductor integrated circuit device 5000.1.

As shown in FIG. 24, semiconductor integrated circuit device 5000.1 is provided with data holding circuit 57 and internal power supply circuit 220, which make it possible to automatically suspend the current supply to a chip exhibiting abnormal leakage on the board (or on the wafer card).

Referring to FIG. 24, as described above, the current i for measurement of the operating current value of internal power supply circuit 220 as a target of measurement is supplied from measuring unit 54. Thus, the configuration of measuring unit 54 within control unit 20 of the present embodiment is basically the same as that shown in FIG. 19, and therefore, the same or corresponding portions are denoted by the same reference character, and description thereof is not repeated.

However, compared to the case of FIG. 19 where the value of resistance R3 within internal reference current generating circuit 548 would be sequentially changed by built-in self-test circuit 42, in FIG. 24, the value of resistance R3 is fixed to a prescribed value by built-in self-test circuit 42. Alternatively, the resistance R3 may be the one having resistance of a fixed value, instead of the variable resistance.

Data holding circuit 57 holds the output level from comparator 540 within measuring unit 54. Specifically, data holding circuit 57 includes: a switching circuit 572 selectively transmitting the output of comparator 540 based on a signal from measurement control unit 52; and latch circuits 574.1–574.m (m is a natural number) provided corresponding to the respective internal power supply circuits as the targets of measurement and activated in response to the signal TE from measurement control unit 52 indicating that it is in the test mode. Initially, latch circuits 574.1–574.m each hold data at an "H" level. During the test mode, each of them holds the test result of the corresponding internal power supply circuit, and outputs data of the test result to the corresponding internal power supply circuit. The data output from latch circuits 574.1–574.m are written into memory cell array 240, and read out after completion of the test.

Internal power supply circuit 220 is provided with an AND circuit 222 for control of transmission of activating signal CKE to comparator 204 within the internal power supply circuit according to the potential level of the corresponding latch circuit 574.m among latch circuits 574.1–574.m. The data in latch circuit 574.1–574.m is set to an H level in the normal operation, which renders comparator 204 within voltage converting circuit VDC to an operating state when the chip is activated in response to activation of signal CKE.

By comparison, in the testing operation, the level held in latch circuit 574.1–574.m is set to an L level upon detection of an abnormal leakage current. Thus, comparator 204 is set to an inactive state constantly, regardless of the level of signal CKE. Accordingly, transistor TP200 is shut down, and the power supply to internal circuit 100.8 is suspended. This enables complete separation of the abnormal internal circuit from the external power supply.

In FIG. 24, latch circuits 574.1–574.m are provided corresponding to the respective internal power supply circuits, and the connection between each internal power supply circuit and power supply interconnection VCL is shut down individually. Alternatively, in the case where there is only one internal power supply circuit within semiconductor integrated circuit device 5000.1, switching circuit 572 becomes unnecessary, and only one latch circuit 574.1 will suffice.

In the case where there are a plurality of internal power supply circuits within semiconductor integrated circuit device 5000.1, it may be configured to shut down the connection between every internal power supply circuit and power supply interconnection VCL when any one of the internal power supply circuits has an operating current exceeding a prescribed value. In this case, again, switching circuit 572 becomes unnecessary, and only one latch circuit 574.1 will suffice. At this time, the output of latch circuit 574.1 is supplied to one input node of the AND circuit 222 in every internal power supply circuit.

Variation of Fifth Embodiment

Figure 25:
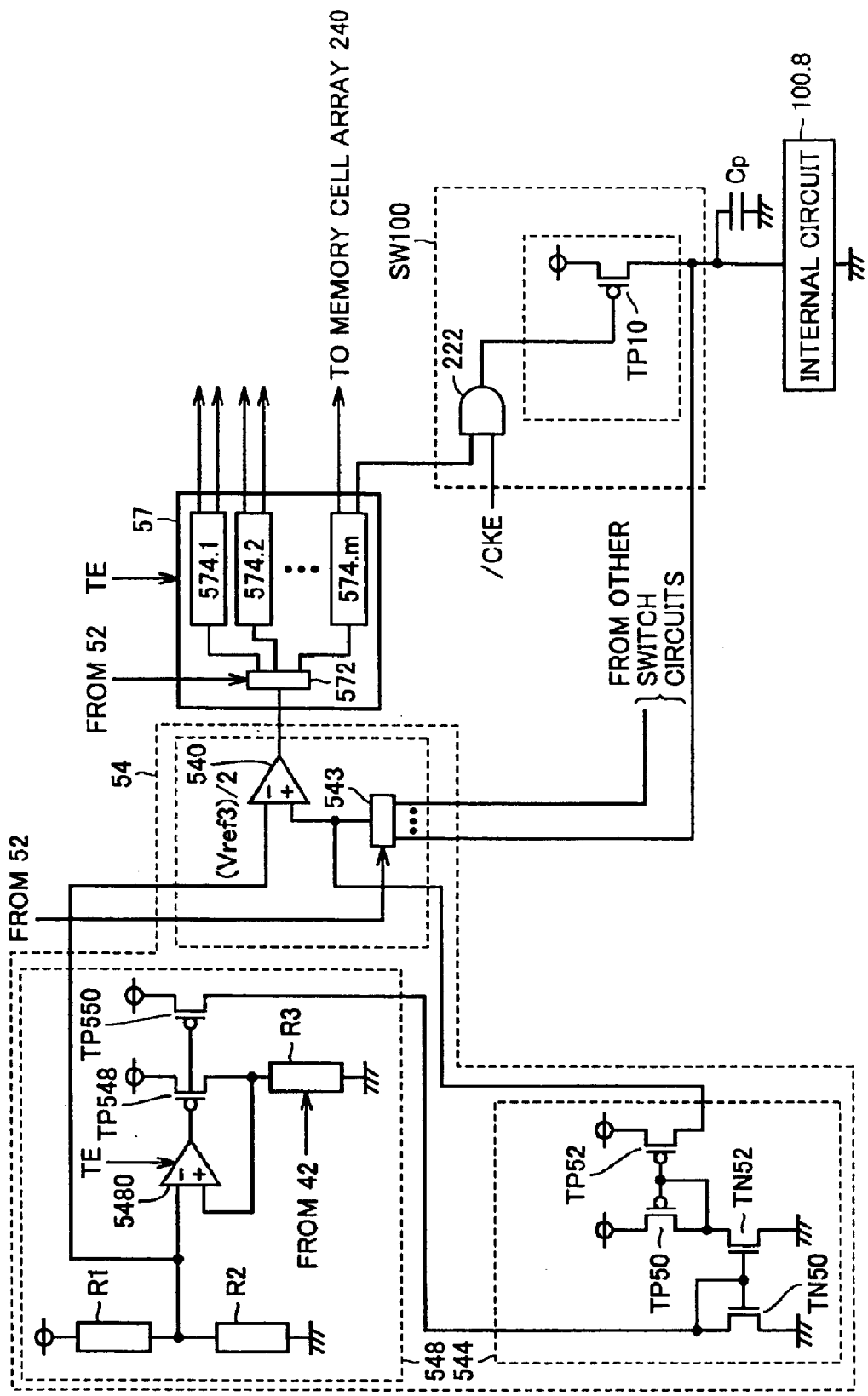
FIG. 25 is a schematic block diagram illustrating a configuration of a variation of the fifth embodiment.

FIG. 25 schematically shows a configuration of the variation of the fifth embodiment wherein a switch SW100 is inserted between internal circuit 100.8 and power supply interconnection VCL.

The configuration shown in FIG. 25 differs from that in FIG. 24 in that voltage converting circuit VDC is replaced with the switch circuit SW100.

When measuring the leakage current, the transistor TP10 within switch circuit SW100 is shut down, so that only the reference current i is supplied to internal circuit 100.8. As a result of the measurement, if it is confirmed that the leakage current is greater than a prescribed value, the data held at latch circuit 574.m attains an L level. Therefore, switch SW100 becomes constantly at a shutdown state, regardless of the level of an inverted signal/CKE of signal CKE.

Accordingly, internal circuit 100.8 with an abnormal leakage current is prevented from affecting the measurement result of another chip.

Sixth Embodiment

Figure 26:
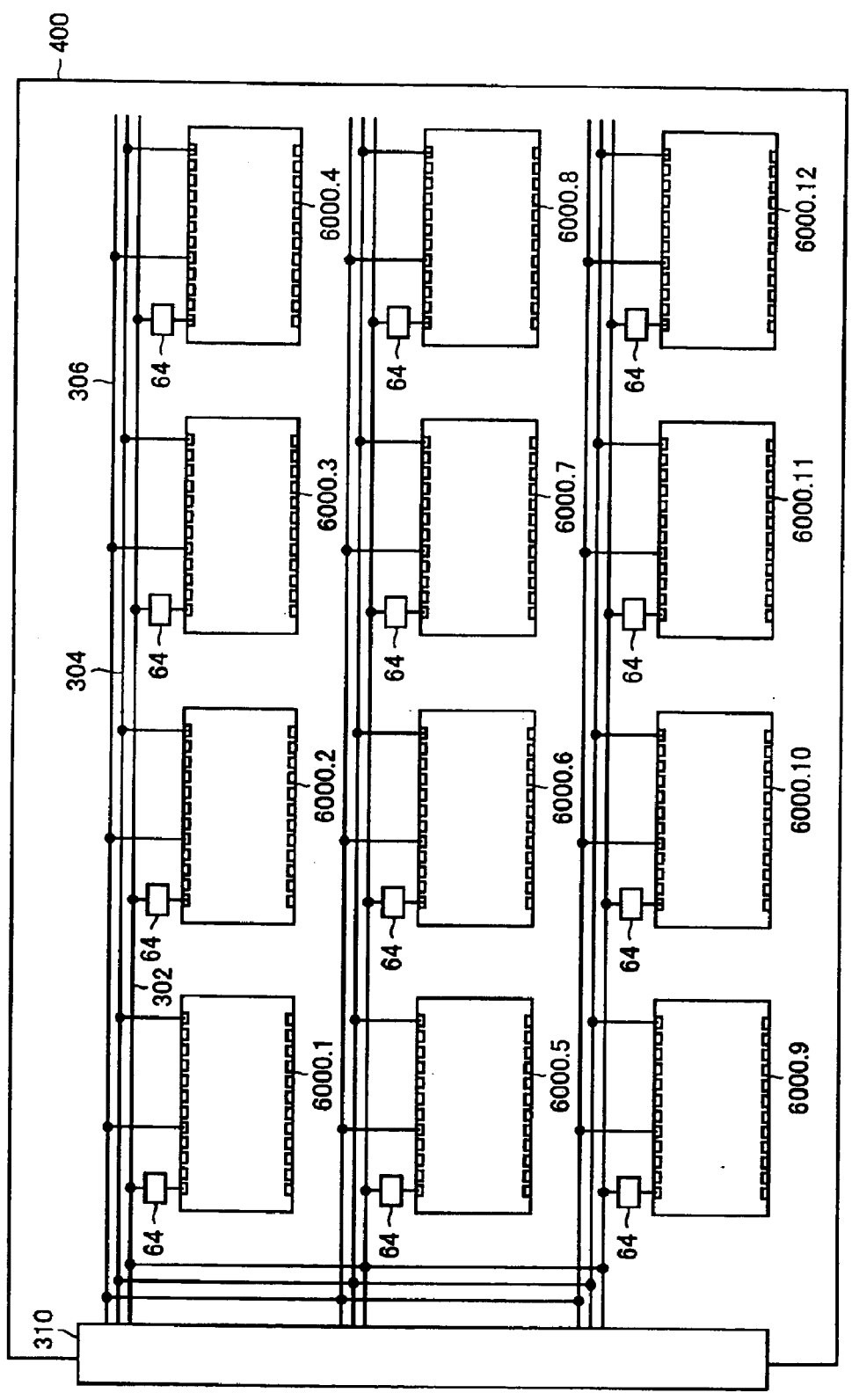
FIG. 26 is a schematic block diagram illustrating a configuration of the board 400 according to a sixth embodiment of the present invention.

FIG. 26 schematically shows a configuration of the sixth embodiment wherein a circuit for detecting the operating current value of an internal circuit is placed on the board (or on the wafer card), as a substitute for measuring unit 54.

Specifically, unlike the board 300 shown in FIG. 23, in the board shown in FIG. 26, a measuring circuit 64 is provided between respective semiconductor integrated circuit device 6000.1–6000.12 and power supply interconnection 302.

Figure 27:
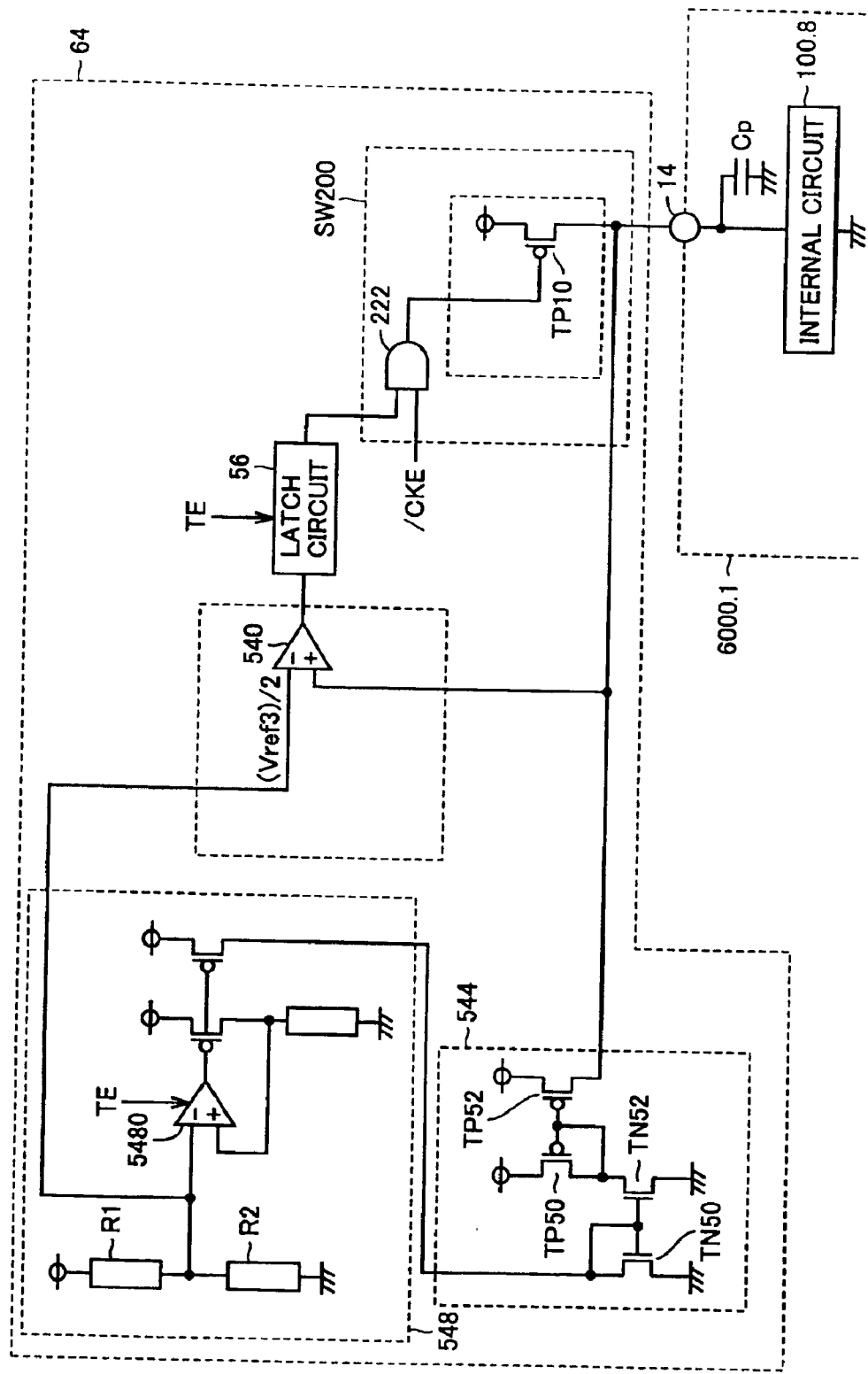
FIG. 27 is a schematic block diagram selectively illustrating configurations of the measuring circuit 64 and a portion of the semiconductor integrated circuit device 6000.1 connected thereto.

FIG. 27 schematically shows configurations of measuring circuit 64 and a portion of semiconductor integrated circuit device 6000.1 connected thereto.

The configuration shown in FIG. 27 differs from that in FIG. 25 in that, while measuring unit 54 was provided within semiconductor integrated circuit device 5000.1 in FIG. 25, measuring circuit 64 is provided on the board in FIG. 27, outside semiconductor integrated circuit device 6000.1.

Therefore, the P channel MOS transistor TP10 within the switch circuit SW200 replacing the switch circuit SW100 of FIG. 25 is coupled via power supply terminal 14 of semiconductor integrated circuit device 6000.1 and power supply interconnection VCL to internal circuit 100.8.

Further, the plus input node of comparator 540 is directly coupled to the output of current mirror circuit 544, since it cannot be selectively coupled to one of the plurality of internal circuits via terminal 14.

Still further, the signal TE for control of comparator 5480 of reference current generating circuit 548 and latch circuit 56 is applied from an external tester. Latch circuit 56 stores the tested results of operating current values for the entire semiconductor integrated circuit device 6000.1.

Otherwise, the configuration of the present variation is identical to the configuration shown in FIG. 25, and thus, the same or corresponding portions are denoted by the same reference character, and description thereof is not repeated.

With such a configuration, when a plurality of semiconductor integrated circuit devices are being tested in a batch, the one having an internal circuit exhibiting an abnormal operating current is isolated from power supply interconnection 302, and thus is prevented from affecting the measurement results of the other semiconductor integrated circuit devices.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device formed on a main surface of a semiconductor substrate, comprising:
a plurality of internal circuits formed on said main surface;
a first power supply interconnection for supplying a first external power supply potential externally provided to said semiconductor integrated circuit device to said plurality of internal circuits;
a second power supply interconnection for supplying a second external power supply potential externally provided to said semiconductor integrated circuit device to said plurality of internal circuits;
an internal power supply circuit, provided between a prescribed one of said plurality of internal circuits and said second power supply interconnection, for converting a level of said second external power supply potential to supply an internal power supply potential to said prescribed internal circuit;
a testing circuit for conducting a self-test of said semiconductor integrated circuit device,
said testing circuit including a measuring circuit for detecting a current amount being supplied from said internal power supply circuit to said prescribed internal circuit; and
a data output circuit for outputting said detected result outside said semiconductor integrated circuit device.

2. The semiconductor integrated circuit device according to claim 1, wherein
said internal power supply circuit includes a voltage converting unit supplying said internal power supply potential to a power supply node of said prescribed internal circuit in a testing operation with a second current supplying capability that is lower than a first current supplying capability in an operation of said prescribed internal circuit, and
said measuring circuit detects said current amount by detecting a change in potential level of said power supply node in said testing operation.

3. The semiconductor integrated circuit device according to claim 1, wherein
said internal power supply circuit includes
a first voltage converting circuit for supplying said internal power supply potential to a power supply node of said prescribed internal circuit with a first current supplying capability in an operation of said prescribed internal circuit and
a second voltage converting circuit for supplying said internal power supply potential to said power supply node with a second current supplying capability that is smaller than said first current supplying capability in said operation and during standby of said prescribed internal circuit and in a testing operation, and
said measuring circuit detects said current amount by detecting a change in potential level of said power supply node in said testing operation with said first voltage converting circuit being suspended.

4. The semiconductor integrated circuit device according to claim 3, wherein said measuring circuit includes a comparing circuit comparing the potential level of said power supply node with a prescribed reference potential in said testing operation to detect said current amount.

5. The semiconductor integrated circuit device according to claim 4, wherein
said testing circuit further includes a storage circuit for storing the detected result of said measuring circuit in said testing operation, and
said data output circuit outputs said detected result stored in said storage circuit.

6. The semiconductor integrated circuit device according to claim 5, wherein said storage circuit stores data externally output from said internal circuit in a normal operation.

7. The semiconductor integrated circuit device according to claim 4, wherein
said plurality of internal circuits include a memory circuit for storing data externally supplied to said semiconductor integrated circuit device in a normal operation, said memory circuit storing a detected result of said measuring circuit in a testing operation, and
said data output circuit outputs said detected result stored in said memory circuit.

8. The semiconductor integrated circuit device according to claim 1, wherein
said internal power supply circuit includes a voltage converting circuit for supplying said internal power supply potential to a power supply node of said prescribed internal circuit with a first current supplying capability in an operation of said prescribed internal circuit,
said testing circuit further includes a reference current generating circuit for supplying a power supply current to said power supply node with a second current supplying capability in a testing operation, and
said measuring circuit detects said current amount by detecting a change in potential level of said power supply node in said testing operation with said voltage converting circuit being suspended.

9. The semiconductor integrated circuit device according to claim 8, wherein
said reference current generating circuit includes
an input terminal for controlling said power supply current value from said reference current generating circuit from an outside of said semiconductor integrated circuit device, and
a current generating circuit for changing said power supply current value according to a signal applied to said input terminal.

10. The semiconductor integrated circuit device according to claim 9, wherein
said power supply current value is changed in a plurality of stages, and
said measuring circuit detects said current amount by comparing a potential level of said power supply node at each of said power supply current values changed in the stages with a reference potential.

11. The semiconductor integrated circuit device according to claim 10, wherein
said testing circuit includes
first and second holding circuits for respectively holding a comparison result of said measuring circuit with the power supply current value of a preceding stage and a comparison result of said measuring circuit with the power supply current value of a present stage, and
a logic circuit detecting a change point of the comparison results based on said comparison results held in said first and second holding circuits.

12. The semiconductor integrated circuit device according to claim 11, wherein said logic circuit includes an exclusive OR circuit performing an exclusive OR operation for the comparison results held in said first and second holding circuits.

13. The semiconductor integrated circuit device according to claim 11, wherein said testing circuit includes a coding circuit coding said power supply current values changed in said plurality of stages.

14. The semiconductor integrated circuit device according to claim 13, wherein said plurality of internal circuits include a memory circuit for storing data externally provided to said semiconductor integrated circuit device in a normal operation, and said testing circuit further includes a transmitting circuit for storing said coded power supply current value to said memory circuit according to a detected result of said logic circuit in the testing operation.

15. A semiconductor integrated circuit device formed on a main surface of a semiconductor substrate, comprising:

a plurality of internal circuits formed on said main surface;

a first power supply interconnection for supplying a first external power supply potential externally provided to said semiconductor integrated circuit device to said plurality of internal circuits;

a second power supply interconnection for supplying a second external power supply potential externally provided to said semiconductor integrated circuit device to said plurality of internal circuits;

an internal power supply control circuit provided between a prescribed one of said plurality of internal circuits and said second power supply interconnection for controlling supply of an internal power supply potential to said prescribed internal circuit;

a testing circuit for conducting a self-test of said semiconductor integrated circuit device, said testing circuit including a measuring circuit for detecting a current amount being provided from said second power supply interconnection to said prescribed internal circuit; and a data output circuit for outputting said detected result outside said semiconductor integrated circuit device.

16. The semiconductor integrated circuit device according to claim 15, wherein said internal power supply control circuit includes an internal power supply circuit capable of selectively supplying the internal power supply potential obtained by converting a level of said second external power supply potential to a power supply node of said prescribed internal circuit.

17. The semiconductor integrated circuit device according to claim 15, wherein said internal power supply control circuit includes a switch circuit capable of selectively conducting potential supply from said second power supply interconnection to a power supply node of said prescribed internal circuit.

18. The semiconductor integrated circuit device according to claim 15, wherein said testing circuit includes a reference current generating circuit for supplying a power supply current to said power supply node with a variable current supply amount in a testing operation, and said measuring circuit detects said current amount by detecting a change in potential level of said power supply node in said testing operation with the potential supply from said internal power supply control circuit to said power supply node being suspended.

19. The semiconductor integrated circuit device according to claim 18, wherein said reference current generating circuit includes a reference potential generating circuit for generating a prescribed reference potential, a variable resistance having an end coupled to a prescribed potential, and a current source circuit generating said power supply current according to a comparison result of a potential at another end of said variable resistance with said prescribed reference potential.

20. The semiconductor integrated circuit device according to claim 19, wherein said testing circuit further includes a test control circuit changing said power supply current value in a plurality of stages in said testing operation, and said measuring circuit detects said current amount by comparing a potential level of said power supply node at each of said power supply current values changed in the stages with a reference potential.

21. The semiconductor integrated circuit device according to claim 20, wherein said testing circuit includes first and second holding circuits for respectively holding a comparison result of said measuring circuit with the power supply current value of a preceding stage and a comparison result of said measuring circuit with the power supply current value of a present stage, and a logic circuit detecting a change point of the comparison results based on said comparison results held in said first and second holding circuits.

22. The semiconductor integrated circuit device according to claim 21, wherein said logic circuit includes an exclusive OR circuit performing an exclusive OR operation for the comparison results held in said first and second holding circuits.

23. The semiconductor integrated circuit device according to claim 21, wherein said testing circuit includes a coding circuit coding said power supply current values changed in said plurality of stages.

24. The semiconductor integrated circuit device according to claim 23, wherein said plurality of internal circuits include a memory circuit for storing data externally provided to said semiconductor integrated circuit device in a normal operation, and said testing circuit further includes a transmitting circuit for storing said coded power supply current values to said memory circuit according to a detected result of said logic circuit in the testing operation.

25. A semiconductor integrated circuit device formed on a main surface of a semiconductor substrate, comprising:

a plurality of internal circuits formed on said main surface;

a first power supply interconnection for supplying a first external power supply potential externally provided to said semiconductor integrated circuit device to said plurality of internal circuits;

a second power supply interconnection for supplying a second external power supply potential externally provided to said semiconductor integrated circuit device to said plurality of internal circuits;

an internal power supply control circuit provided between a prescribed one of said plurality of internal circuits and said second power supply interconnection for controlling supply of an internal power supply potential to said prescribed internal circuit;

a testing circuit for conducting a self-test of said semiconductor integrated circuit device, said testing circuit including a measuring circuit for detecting a current amount being supplied from said second power supply interconnection to said prescribed internal circuit; and a shutdown circuit suspending potential supply from said internal power supply control circuit to a power supply node of said prescribed internal circuit according to said detected result.

26. The semiconductor integrated circuit device according to claim 25, wherein said internal power supply control circuit includes an internal power supply circuit that is controlled by said shutdown circuit and is capable of selectively supplying an internal power supply potential obtained by converting a level of said second external power supply potential to a power supply node of said prescribed internal circuit.

27. The semiconductor integrated circuit device according to claim 25, wherein said internal power supply control circuit includes a switch circuit that is controlled by said shutdown circuit and is capable of selectively performing potential supply from said second power supply interconnection to a power supply node of said prescribed internal circuit.

28. A testing circuit for testing a plurality of semiconductor integrated circuit devices in a batch, comprising:

a signal interconnection commonly provided for said plurality of semiconductor integrated circuit devices for sending signals to and receiving signals from said plurality of semiconductor integrated circuit devices;

a first power supply interconnection commonly provided for said plurality of semiconductor integrated circuit devices for supplying a first external power supply potential;

a second power supply interconnection commonly provided for said plurality of semiconductor integrated circuit devices for supplying a second external power supply potential;

a power supply control circuit provided between each said semiconductor integrated circuit device and said second power supply interconnection for controlling the supply of said second power supply potential to said relevant semiconductor integrated circuit device;

a testing circuit provided for each said semiconductor integrated circuit device for detecting a current amount being supplied from said second power supply interconnection to said relevant semiconductor integrated circuit device; and a shutdown circuit provided for each said semiconductor integrated circuit device for suspending potential supply from said power supply control circuit to said relevant semiconductor integrated circuit device according to a detected result of said testing circuit.

* * * * *